US012805128B2

(12) United States Patent
Miyamoto et al.

(10) Patent No.: US 12,805,128 B2
(45) Date of Patent: Nov. 17, 2026

(54) DISPLAY DEVICE AND METHOD OF MANUFACTURING DISPLAY DEVICE

(71) Applicant: Sharp Display Technology Corporation, Kameyama City (JP)

(72) Inventors: Tadayoshi Miyamoto, Kameyama City (JP); Yoshinobu Nakamura, Kameyama City (JP); Toshihiro Kaneko, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 390 days.

(21) Appl. No.: 18/574,429

(22) PCT Filed: Aug. 18, 2021

(86) PCT No.: PCT/JP2021/030237
§ 371 (c)(1),
(2) Date: Dec. 27, 2023

(87) PCT Pub. No.: WO2023/021623
PCT Pub. Date: Feb. 23, 2023

(65) Prior Publication Data

US 2024/0292676 A1 Aug. 29, 2024

(51) Int. Cl.
*H10K 59/124* (2023.01)
*H10K 59/12* (2023.01)

(52) U.S. Cl.
CPC ....... *H10K 59/124* (2023.02); *H10K 59/1201* (2023.02)

(58) Field of Classification Search
CPC ............ H10K 59/124; H10K 59/1201; H10K 59/1213; H10K 59/131; G09F 9/30
USPC ............ 257/40
See application file for complete search history.

(56) References Cited

U.S. PATENT DOCUMENTS

2018/0226462 A1 8/2018 Zhou et al.
2018/0294286 A1* 10/2018 Yamaguchi .......... H10K 59/131
2019/0312061 A1* 10/2019 Son ...................... H10D 86/423
2020/0395488 A1 12/2020 Takechi et al.

FOREIGN PATENT DOCUMENTS

CN 112331680 A 2/2021
JP 2020-017558 A 1/2020
JP 2020-202223 A 12/2020
JP 2020-205402 A 12/2020

* cited by examiner

*Primary Examiner* — Tong-Ho Kim
(74) *Attorney, Agent, or Firm* — ScienBiziP, P.C.

(57) ABSTRACT

A first TFT includes: a first semiconductor layer of a polysilicon; and a first gate electrode on the first semiconductor layer via a first gate insulating film. A second TFT includes: a first conductive layer and a second conductive layer made of the same material, and provided in the same layer, as the first semiconductor layer; a second semiconductor layer of an oxide semiconductor on the first conductive layer and the second conductive layer; and a second gate electrode on the second semiconductor layer via the second gate insulating film.

20 Claims, 13 Drawing Sheets

DISPLAY DEVICE AND METHOD OF MANUFACTURING DISPLAY DEVICE

TECHNICAL FIELD

The disclosure relates to display devices and methods of manufacturing display devices.

BACKGROUND ART

The organic EL display device, or the self-luminous display device built around organic electroluminescence elements (hereinafter, may be referred to as "organic EL elements"), has been attracting attention as a promising successor to the liquid crystal display device. The organic EL display device includes a plurality of thin film transistors (hereinafter, may be referred to as "TFTs") in each subpixel which provides a minimum unit of images. Well-known examples of a semiconductor layer in such a TFT include a semiconductor layer of a polysilicon which exhibits high mobility and a semiconductor layer of an oxide semiconductor such as In—Ga—Zn—O which causes small leakage current.

As an example, JP 2020-17558 A discloses a display device having a hybrid structure in which polysilicon semiconductor-based, first TFTs and oxide semiconductor-based, second TFTs are both formed on a substrate.

CITATION LIST

Patent Literature

SUMMARY

Technical Problem

Meanwhile, in the display device having a hybrid structure disclosed in JP 2020-17558 A mentioned above, contact holes can be collectively formed for electrically connecting to the polysilicon semiconductor and the oxide semiconductor because a metal film is brought into contact with the oxide semiconductor with the contact holes being formed through the metal film. However, it is difficult to simultaneously perform ion doping on the polysilicon semiconductor and the oxide semiconductor in the display device having a hybrid structure disclosed in JP 2020-17558 A mentioned above, because the insulating film on the polysilicon semiconductor and the insulating film on the oxide semiconductor have different thicknesses. There is room for improvement here.

The disclosure has been made in view of these issues and has an object to collectively form contact holes for electrically connecting to polysilicon-based and oxide semiconductor-based semiconductor layers and also to simultaneously perform ion doping on these semiconductor layers.

Solution to Problem

To achieve the object, a display device in accordance with the disclosure includes: a base substrate layer; and a thin film transistor layer on the base substrate layer, the thin film transistor layer including, in each of a plurality of subpixels: a first thin film transistor including a first semiconductor layer of a polysilicon; and a second thin film transistor including a second semiconductor layer of an oxide semiconductor, wherein the first thin film transistor includes: the first semiconductor layer including a first conductive region and a second conductive region at a distance from each other; a first gate insulating film on the first semiconductor layer; a first gate electrode on the first gate insulating film, the first gate electrode being configured to control conduction between the first conductive region and the second conductive region; an interlayer insulating film covering the first gate electrode; and a first terminal electrode and a second terminal electrode on the interlayer insulating film at a distance from each other, the first terminal electrode and the second terminal electrode being electrically connected respectively to the first conductive region and the second conductive region via a first contact hole and a second contact hole formed at least through the interlayer insulating film, the second thin film transistor includes: the second semiconductor layer including a third conductive region and a fourth conductive region at a distance from each other; a first conductive layer and a second conductive layer on a base substrate layer side of the third conductive region and the fourth conductive region respectively, the first conductive layer and the second conductive layer being made of a same material, and provided in a same layer, as the first semiconductor layer; a second gate insulating film on the second semiconductor layer; a second gate electrode on the second gate insulating film, the second gate electrode being configured to control conduction between the third conductive region and the fourth conductive region; the interlayer insulating film covering the second gate electrode; and a third terminal electrode and a fourth terminal electrode on the interlayer insulating film at a distance from each other, the third terminal electrode and the fourth terminal electrode being electrically connected respectively to the first conductive layer and the second conductive layer via a third contact hole and a fourth contact hole formed at least through the interlayer insulating film, and the second gate insulating film is made of a same material, and provided in a same layer, as the first gate insulating film.

In addition, a method of manufacturing a display device in accordance with the disclosure is a method of manufacturing a display device including: a base substrate layer; and a thin film transistor layer on the base substrate layer, the thin film transistor layer including, in each of a plurality of subpixels: a first thin film transistor including a first semiconductor layer of a polysilicon; and a second thin film transistor including a second semiconductor layer of an oxide semiconductor, wherein the first thin film transistor includes: the first semiconductor layer including a first conductive region and a second conductive region at a distance from each other; a first gate insulating film on the first semiconductor layer; a first gate electrode on the first gate insulating film, the first gate electrode being configured to control conduction between the first conductive region and the second conductive region; an interlayer insulating film covering the first gate electrode; and a first terminal electrode and a second terminal electrode on the interlayer insulating film at a distance from each other, the first terminal electrode and the second terminal electrode being electrically connected respectively to the first conductive region and the second conductive region via a first contact hole and a second contact hole formed at least through the interlayer insulating film, and the second thin film transistor includes: the second semiconductor layer including a third conductive region and a fourth conductive region at a distance from each other; a first conductive layer and a second conductive layer on a base substrate layer side of the third conductive region and the fourth conductive region respectively, the first conductive layer and the second conductive layer being made of a same material, and provided in a same layer, as the first semiconductor layer; a second gate insulating film on the second semiconductor layer; a second gate electrode on the second gate insulating film, the second gate electrode being configured to control conduction between the third conductive region and the fourth conductive region; the interlayer insulating film covering the second gate electrode; and a third terminal electrode and a fourth terminal electrode on the interlayer insulating film at a distance from each other, the third terminal electrode and the fourth terminal electrode being electrically connected respectively to the first conductive layer and the second conductive layer via a third contact hole and a fourth contact hole formed at least through the interlayer insulating film, the method including: a first semiconductor layer formation step of forming, on the base substrate layer, the first semiconductor layer, a first polysilicon layer that will be the first conductive layer, and a second polysilicon layer that will be the second conductive layer; a second semiconductor layer formation step of forming the second semiconductor layer on the first polysilicon layer and the second polysilicon layer; a gate insulating film formation step of forming the first gate insulating film and the second gate insulating film so as to cover the first semiconductor layer and the second semiconductor layer respectively; a gate electrode formation step of forming the first gate electrode and the second gate electrode on the first gate insulating film and the second gate insulating film respectively; an ion doping step of forming the first conductive region and the second conductive region in the first semiconductor layer and forming the third conductive region and the fourth conductive region in the second semiconductor layer by doping the first semiconductor layer with impurity ions using the first gate electrode as a mask and also doping the second semiconductor layer, the first polysilicon layer, and the second polysilicon layer with impurity ions using the second gate electrode as a mask and of forming the first conductive layer and the second conductive layer by modifying the first polysilicon layer and the second polysilicon layer into a conductor; an interlayer insulating film formation step of, after the interlayer insulating film is formed so as to cover the first gate electrode and the second gate electrode, forming the first contact hole, the second contact hole, the third contact hole, and the fourth contact hole at least through the interlayer insulating film; and a terminal electrode formation step of forming the first terminal electrode, the second terminal electrode, the third terminal electrode, and the fourth terminal electrode on the interlayer insulating film.

Advantageous Effects of Disclosure

The disclosure enables collectively forming contact holes for electrically connecting to polysilicon-based and oxide semiconductor-based semiconductor layers and also simultaneously performing ion doping on these semiconductor layers.

DESCRIPTION OF EMBODIMENTS

The following will describe embodiments of the disclosure in detail with reference to drawings. Note that the disclosure is not limited to these embodiments.

First Embodiment

Figure 1:
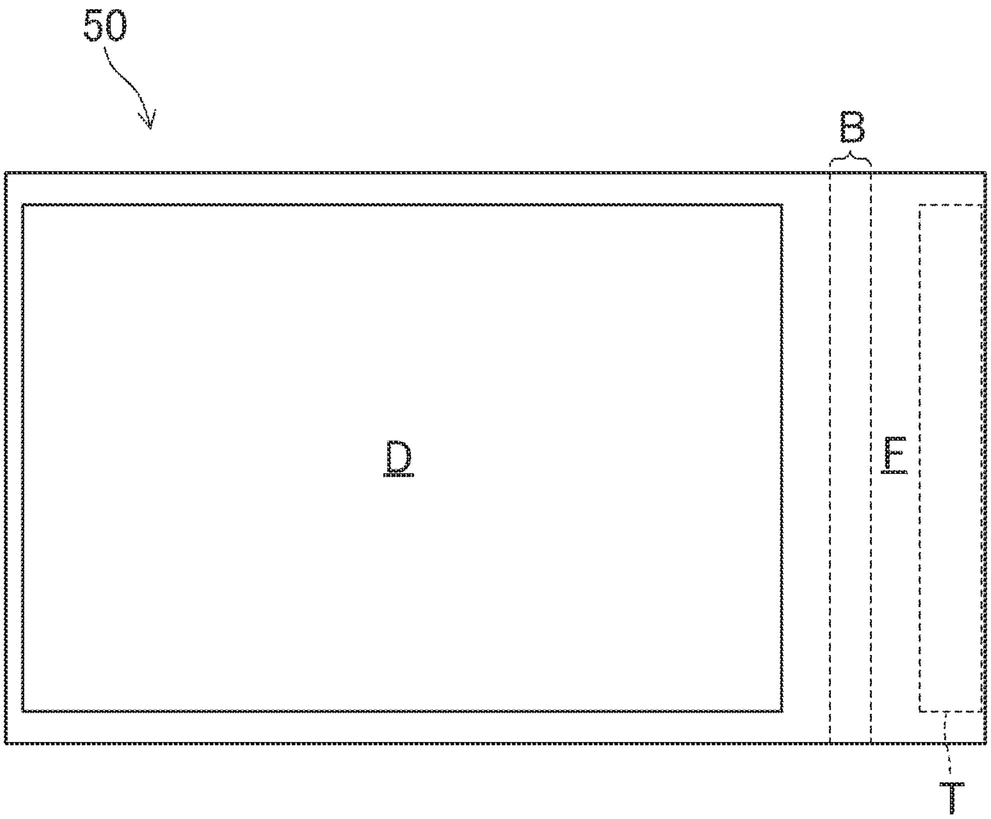
FIG. 1 is a schematic plan view of a structure of an organic EL display device in accordance with a first embodiment of the disclosure.
Figure 2:
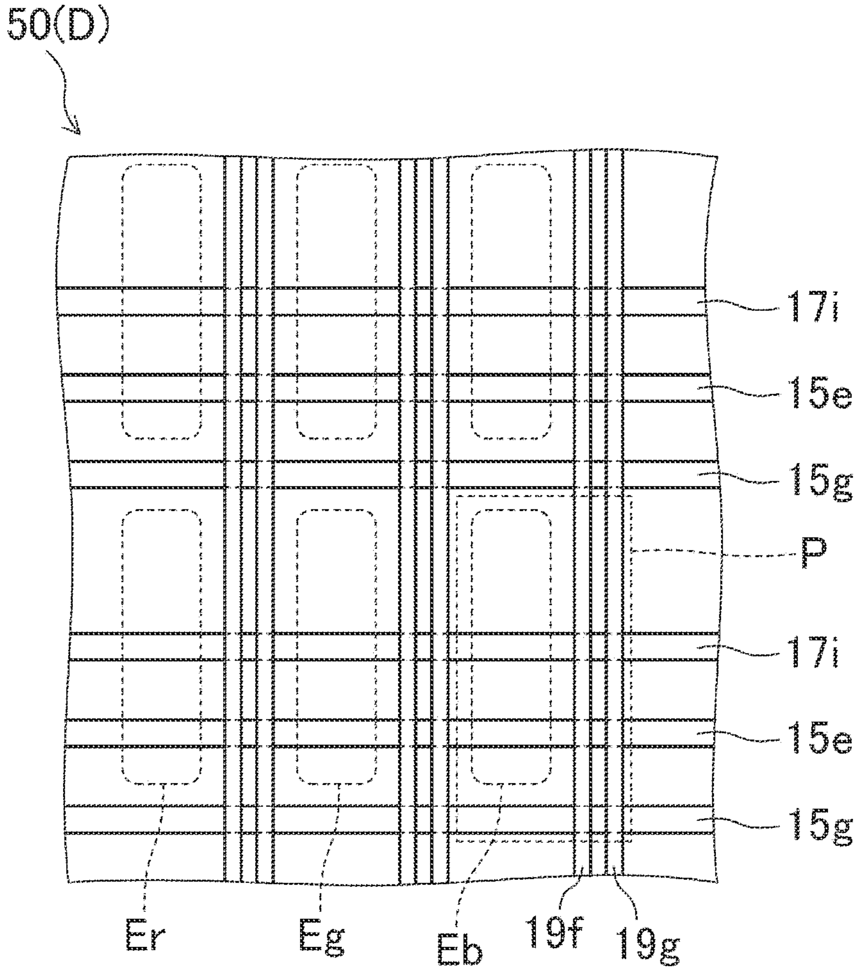
FIG. 2 is a plan view of a display area of the organic EL display device in accordance with the first embodiment of the disclosure.
Figure 3:
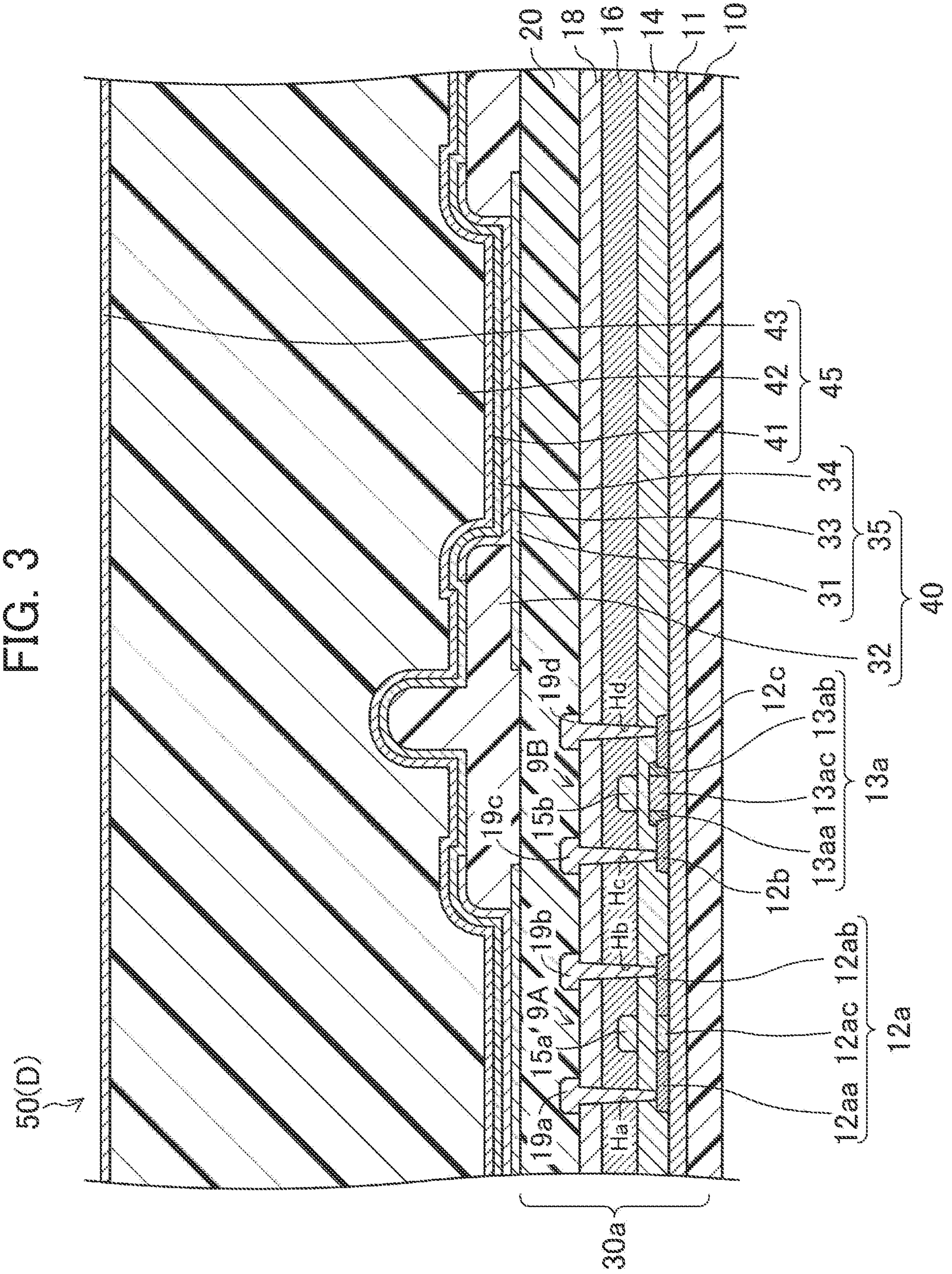
FIG. 3 is a cross-sectional view of the display area of the organic EL display device in accordance with the first embodiment of the disclosure.
Figure 4:
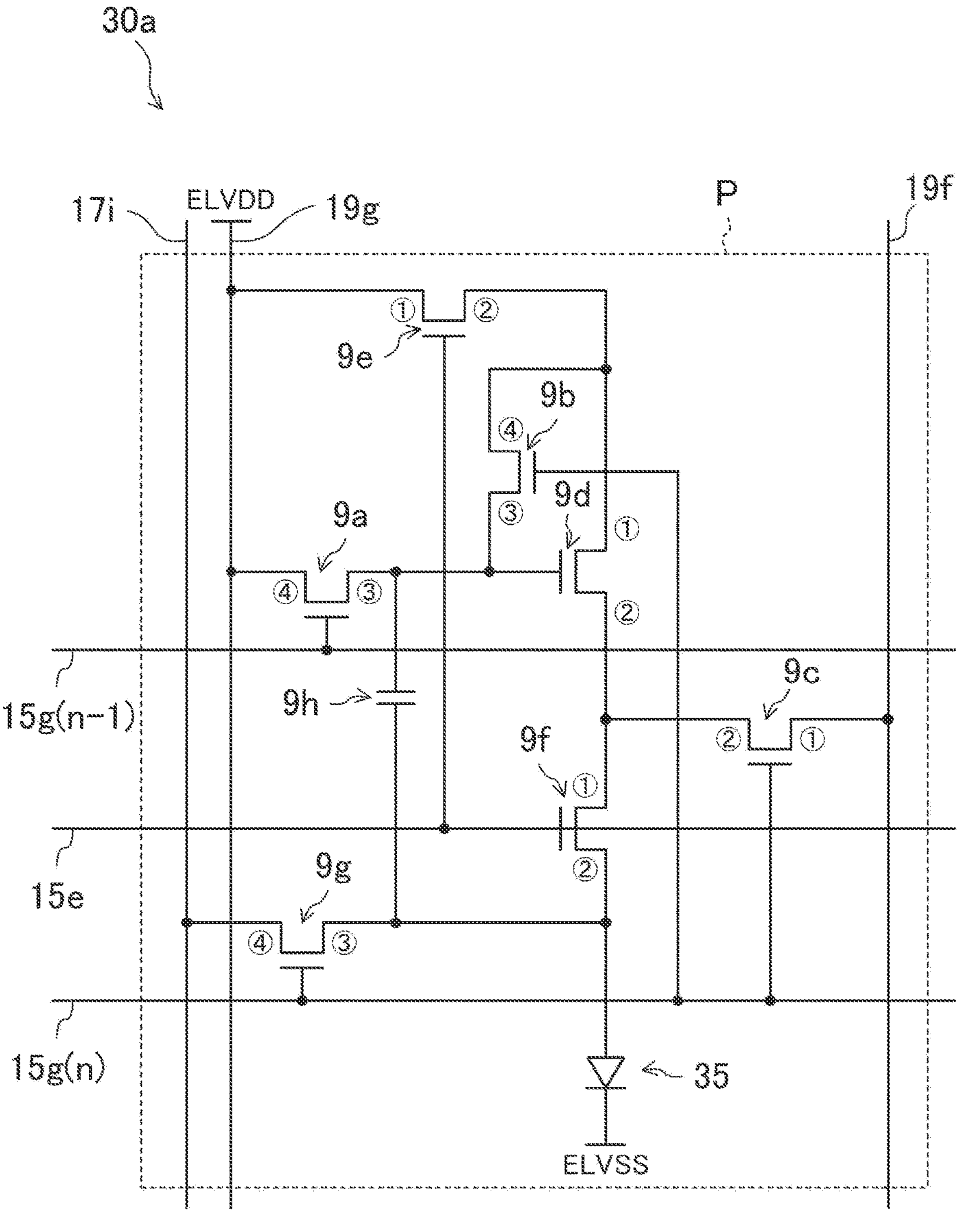
FIG. 4 is an equivalent circuit diagram of a TFT layer that is a part of the organic EL display device in accordance with the first embodiment of the disclosure.
Figure 5:
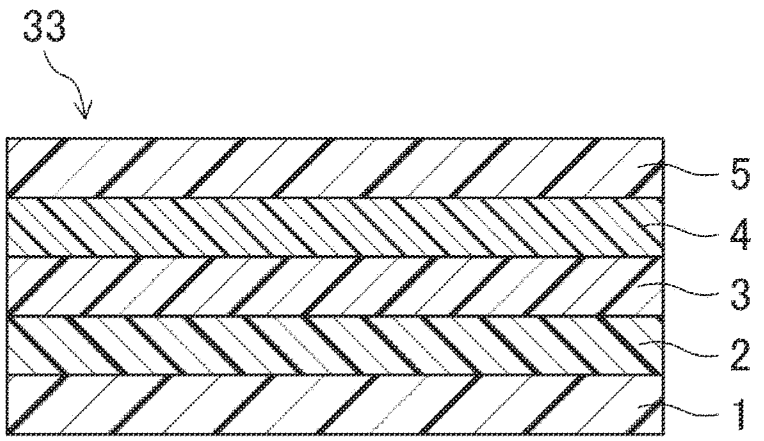
FIG. 5 is a cross-sectional view of an organic EL layer that is a part of the organic EL display device in accordance with the first embodiment of the disclosure.
Figure 6:
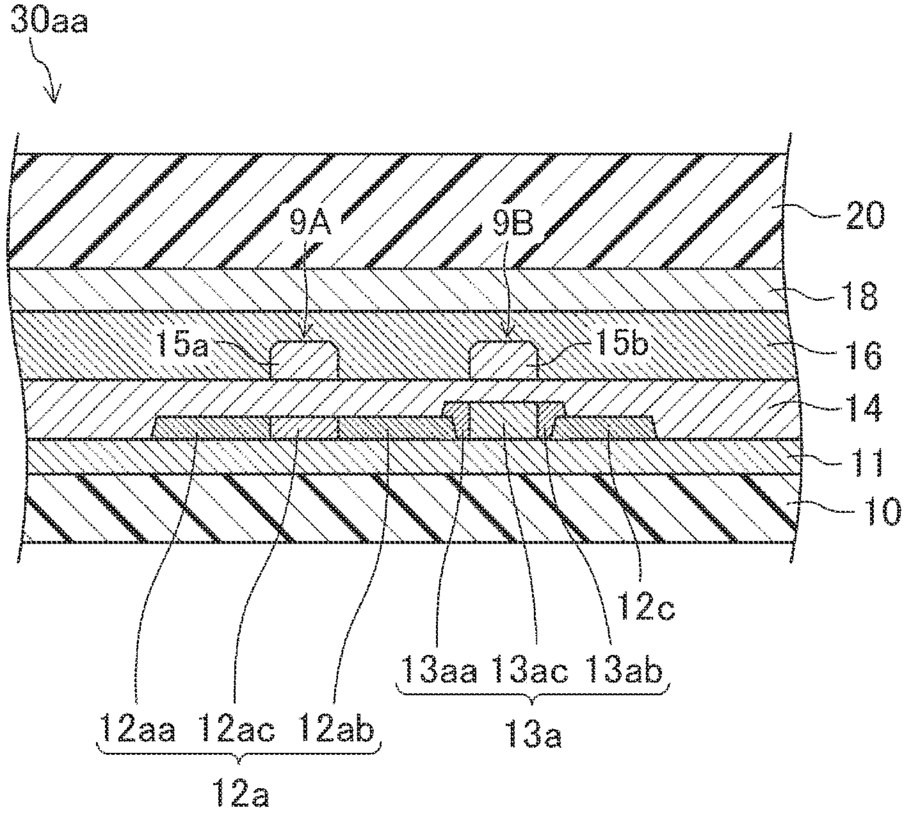
FIG. 6 is a cross-sectional view of a first variation example of the TFT layer that is a part of the organic EL display device in accordance with the first embodiment of the disclosure.
Figure 7:
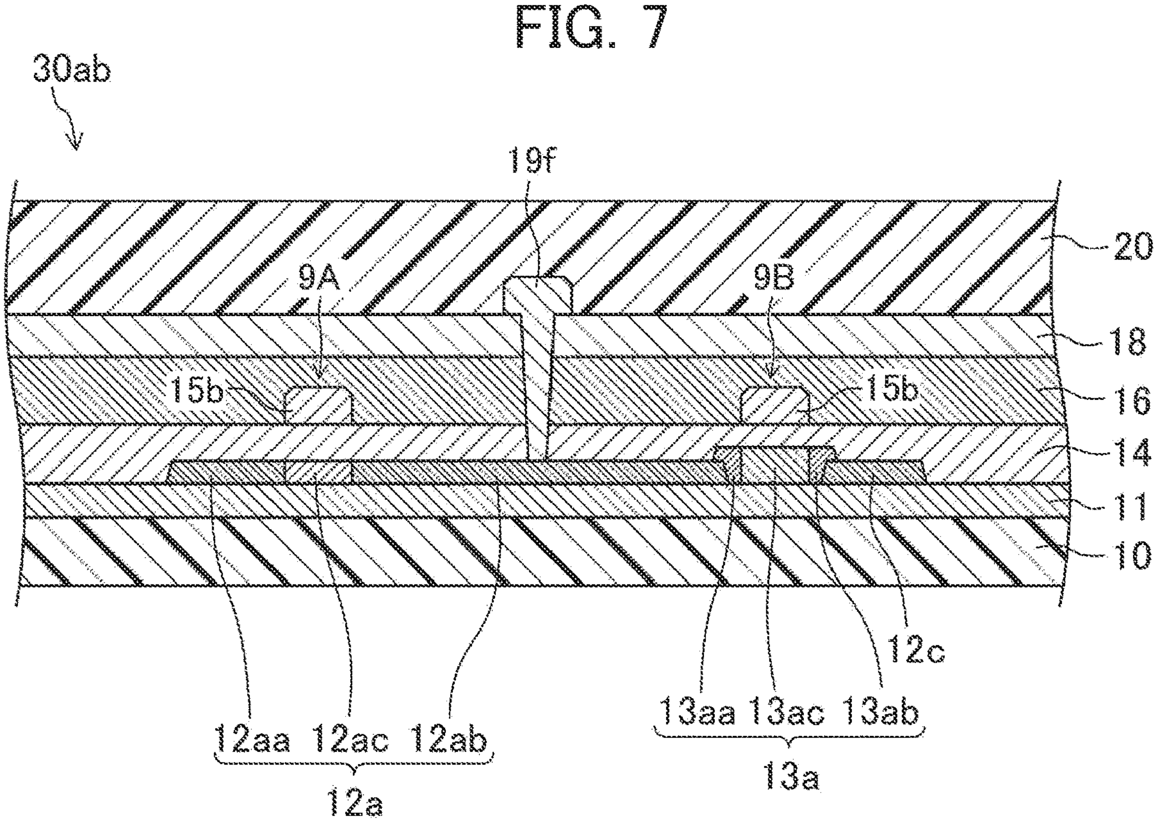
FIG. 7 is a cross-sectional view of a second variation example of the TFT layer that is a part of the organic EL display device in accordance with the first embodiment of the disclosure.
Figure 8:
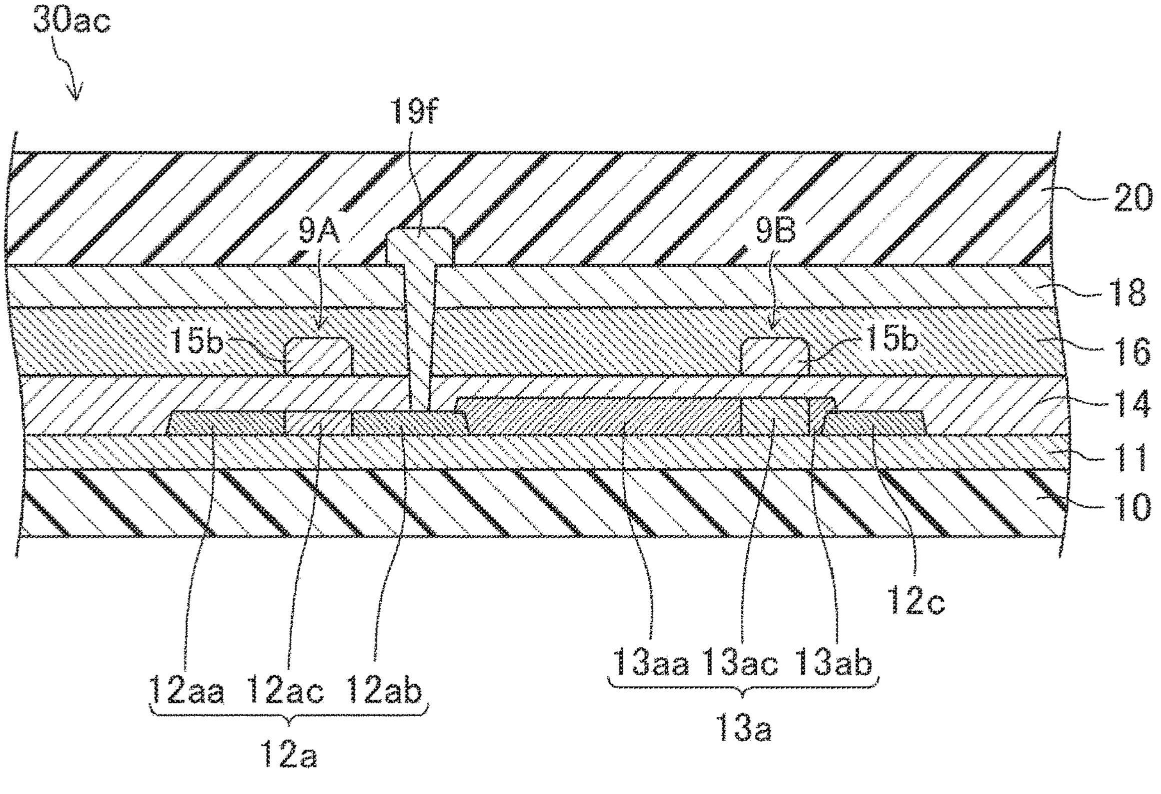
FIG. 8 is a cross-sectional view of a third variation example of the TFT layer that is a part of the organic EL display device in accordance with the first embodiment of the disclosure.

FIGS. 1 to 18 illustrate a first embodiment of a display device and a method of manufacturing a display device, both in accordance with the disclosure. Note that each embodiment below will discuss an organic EL display device including an organic EL element layer as an example of a display device including a light-emitting element layer. Here, FIG. 1 is a schematic plan view of a structure of an organic EL display device 50 in accordance with the present embodiment. In addition, FIGS. 2 and 3 are a plan view and a cross-sectional view, respectively, of a display area D of the organic EL display device 50. In addition, FIG. 4 is an equivalent circuit diagram of a TFT layer 30*a* that is a part of the organic EL display device 50. In addition, FIG. 5 is a cross-sectional view of an organic EL layer 33 that is a part of the organic EL display device 50. In addition, FIGS. 6, 7, and 8 are cross-sectional views of a TFT layer 30*aa*, a TFT layer 30*ab*, and a TFT layer 30*ac* representing a first, a second, and a third variation example respectively of the TFT layer 30*a*.

Referring to FIG. 1, the organic EL display device 50 has, for example, the rectangular display area D for producing image displays and a frame area F surrounding the display area D. Note that the present embodiment gives the rectangular display area D as an example. This rectangular shape encompasses, for example, generally rectangular shapes such as those with a curved side(s), those with a round corner(s), and those with a notched side(s).

There is provided a matrix of subpixels P in the display area D as shown in FIG. 2. In addition, in the display area D, for example, subpixels P each including a red-light-emission region Er for a display in red, a subpixel P including a green-light-emission region Eg for a display in green, and a subpixel P including a blue-light-emission region Eb for a display in blue are provided adjacent to each other as shown in FIG. 2. Note that each pixel in the display area D is formed by, for example, three adjacent subpixels P including a red-light-emission region Er, a green-light-emission region Eg, and a blue-light-emission region Eb.

The frame area F includes a terminal section T along the far right side of the frame area F as in FIG. 1. In addition, the frame area F further includes a bending portion B extending in one direction (in the vertical direction in the drawing) between the display area D and the terminal section T as shown in FIG. 1. The bending portion B can be bent 180° around the vertical direction in the drawing (to form a U-shape).

Referring to FIG. 3, the organic EL display device 50 includes: a resin substrate layer 10 as a base-providing substrate (base substrate); the TFT layer 30*a* on the resin substrate layer 10; an organic EL element layer 40 as a light-emitting element layer on the TFT layer 30*a*; and a sealing film 45 covering the organic EL element layer 40.

The resin substrate layer 10 is made of, for example, a polyimide resin.

Referring to FIG. 3, the TFT layer 30*a* includes: a base coat film 11 on the resin substrate layer 10; four first TFTs 9A, three second TFTs 9B, and one capacitor 9*h*, all on the base coat film 11, in each subpixel P (see FIG. 4); and a planarization film 20 on the first TFTs 9A, the second TFTs 9B, and the capacitor 9*h*. Here, the TFT layer 30*a* includes a plurality of gate lines 15*g* extending parallel to each other in the lateral direction in the drawing as shown in FIG. 2. In addition, the TFT layer 30*a* includes a plurality of light-emission control lines 15*e* extending parallel to each other in the lateral direction in the drawing, as shown in FIG. 2. In addition, the TFT layer 30*a* includes a plurality of second initialization power supply lines 17*i* extending parallel to each other in the lateral direction in the drawing, as shown in FIG. 2. Note that each light-emission control line 15*e* is provided adjacent to an associated one of the gate lines 15*g* and an associated one of the second initialization power supply lines 17*i* as shown in FIG. 2. In addition, the TFT layer 30*a* includes a plurality of source lines 19*f* extending parallel to each other in the vertical direction in the drawing as shown in FIG. 2. In addition, the TFT layer 30*a* includes a plurality of power supply lines 19*g* extending parallel to each other in the vertical direction in the drawing as shown in FIG. 2. Note that each power supply line 19*g* is provided adjacent to an associated one of the source lines 19*f* as shown in FIG. 2. In addition, the gate lines 15*g* and the light-emission control lines 15*e* are provided on a gate insulating film 14 (detailed later), the second initialization power supply lines 17*i* are provided on a first interlayer insulating film 16 (detailed later), and the source lines 19*f* and the power supply lines 19*g* are provided on a second interlayer insulating film 18 (detailed later).

Referring to FIG. 3, each first TFT 9A includes: a first semiconductor layer 12*a* on the base coat film 11; the gate insulating film 14 on the first semiconductor layer 12*a*; a first gate electrode 15*a* on the gate insulating film 14; the first interlayer insulating film 16 and the second interlayer insulating film 18 sequentially provided so as to cover the first gate electrode 15*a*; and a first terminal electrode 19*a* and a second terminal electrode 19*b* on the second interlayer insulating film 18 at a distance from each other.

The base coat film 11, the gate insulating film 14, the first interlayer insulating film 16, and the second interlayer insulating film 18 each include either a monolayer film of, for example, an inorganic insulating film such as silicon nitride, silicon oxide, or silicon oxynitride or a stack of any of these films. Here, at least the base coat film 11 and the gate insulating film 14 include, for example, a silicon oxide film on the second semiconductor layer 13*a* side thereof (detailed later).

The first gate electrode 15*a* overlaps a first channel region 12*ac* (detailed later) of the first semiconductor layer 12*a* and to control conduction between a first conductive region 12*aa* and a second conductive region 12*ab* (both detailed later) of the first semiconductor layer 12*a*, as shown in FIG. 3.

The first semiconductor layer 12*a* contains, for example, a polysilicon such as LTPS (low temperature polysilicon) and includes: the first conductive region 12*aa* and the second conductive region 12*ab* at a distance from each other; and the first channel region 12*ac* between the first conductive region 12*aa* and the second conductive region 12*ab*, as shown in FIG. 3.

The first terminal electrode 19*a* and the second terminal electrode 19*b* are electrically connected respectively to the first conductive region 12*aa* and the second conductive region 12*ab* of the first semiconductor layer 12*a* via a first contact hole Ha and a second contact hole Hb formed through the stack of the gate insulating film 14, the first interlayer insulating film 16, and the second interlayer insulating film 18, as shown in FIG. 3.

Referring to FIG. 3, each second TFT 9B includes: a second semiconductor layer 13*a* on the base coat film 11; a first conductive layer 12*b* and a second conductive layer 12*c* on the resin substrate layer 10 side of a third conductive region 13*aa* and a fourth conductive region 13*ab* (both detailed later) of the second semiconductor layer 13*a* respectively; the gate insulating film 14 on the second semiconductor layer 13*a*, the first conductive layer 12*b*, and the second conductive layer 12*c*; a second gate electrode 15*b* on the gate insulating film 14; the first interlayer insulating film 16 and the second interlayer insulating film 18 sequentially provided so as to cover the second gate electrode 15*b*; and a third terminal electrodes 19*c* and a fourth terminal electrode 19*d* on the second interlayer insulating film 18 at a distance from each other.

The second semiconductor layer 13*a* contains, for example, an oxide semiconductor such as an In—Ga—Zn—O-based semiconductor and includes: the third conductive region 13*aa* and the fourth conductive region 13*ab* at a distance from each other; and a second channel region 13*ac* between the third conductive region 13*aa* and the fourth conductive region 13*ab*, as shown in FIG. 3. Here, the In—Ga—Zn—O-based semiconductor is a ternary oxide of In (indium), Ga (gallium), and Zn (zinc), and the proportion (composition ratio) of In, Ga, and Zn is not limited in any particular manner. In addition, the In—Ga—Zn—O-based semiconductor may be either amorphous or crystalline. Note that a preferred In—Ga—Zn—O-based crystalline semiconductor is an In—Ga—Zn—O-based crystalline semiconductor in which the c axis is oriented substantially perpendicularly to the layer plane. The second semiconductor layer 13*a* may contain an alternative oxide semiconductor in place of the In—Ga—Zn—O-based semiconductor. The alternative oxide semiconductor may be, for example, an In—Sn—Zn—O-based semiconductor (e.g., $In_2O_3$—$SnO_2$—ZnO; InSnZnO). Here, the In—Sn—Zn—O-based semiconductor is a ternary oxide of In (indium), Sn (tin), and Zn (zinc). In addition, the second semiconductor layer 13*a* may contain another oxide semiconductor such as an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, $InGaO_3(ZnO)_5$, magnesium zinc oxide ($Mg_xZn_{1-x}O$), or cadmium zinc oxide ($Cd_xZn_{1-x}O$). Note that the Zn—O-based semiconductor may be ZnO that may or may not be doped with at least one of impurity element species of, for example, Group 1 elements, Group 13 elements, Group 14 elements, Group 15 elements, and Group 17 elements and that may be amorphous, polycrystalline, or microcrystal where a mixed combination of amorphous ZnO and polycrystalline ZnO is present.

The first conductive layer 12*b* and the second conductive layer 12*c* are provided in contact with the resin substrate layer 10 side of the third conductive region 13*aa* and the fourth conductive region 13*ab* on the ends of the second semiconductor layer 13*a* respectively, as shown in FIG. 3. Here, the first conductive layer 12*b* and the second conductive layer 12*c* contain, for example, a polysilicon doped with impurity ions such as phosphorus and are made of the same material, and provided in the same layer, as the first semiconductor layer 12*a*.

Referring to FIG. 3, the second gate electrode 15*b* overlaps the second channel region 13*ac* of the second semiconductor layer 13*a* to control conduction between the third conductive region 13*aa* and the fourth conductive region 13*ab* of the second semiconductor layer 13*a*.

The third terminal electrode 19*c* and the fourth terminal electrode 19*d* are electrically connected respectively to the first conductive layer 12*b* and the second conductive layer 12*c* via a third contact hole Hc and a fourth contact hole Hd formed through the stack of the gate insulating film 14, the first interlayer insulating film 16, and the second interlayer insulating film 18, as shown in FIG. 3.

The present embodiment discusses a write TFT 9*c*, a drive TFT 9*d*, a power supply TFT 9*e*, and a light-emission control TFT 9*f* (all detailed later) as an example of the four first TFTs 9A including the first semiconductor layer 12*a* of a polysilicon and also discusses an initialization TFT 9*a*, a compensation TFT 9*b*, and an anode discharge TFT 9*g* (all detailed later) as an example of the three second TFTs 9B including the second semiconductor layer 13*a* of an oxide semiconductor (see FIG. 4). Note that the equivalent circuit diagram in FIG. 4 denotes a first terminal electrode 20*a* and a second terminal electrode 20*b* of each TFT 9*c*, 9*d*, 9*e*, and 9*f* by a circled 1 and a circled 2 and denotes a third terminal electrode 20*c* and a fourth terminal electrode 20*d* of each TFTs 9*a*, 9*b*, and 9*g* by a circled 3 and a circled 4. In addition, the equivalent circuit diagram in FIG. 4 shows a pixel circuit for the subpixel P that is located in row n, column m and also shows a part of a pixel circuit for the subpixel P that is located in row (n−1), column m. In addition, the equivalent circuit diagram in FIG. 4 shows that the power supply line 19*g* for supplying a high-voltage power supply ELVDD doubles as a first initialization power supply line. Alternatively, the power supply line 19*g* and the first initialization power supply line may be provided separately. In addition, the second initialization power supply line 17*i* is fed with the same voltage as a low-voltage power supply ELVSS. This is however not the only possible implementation of the disclosure. Alternatively, the second initialization power supply line 17*i* may be fed with a voltage that differs from the low-voltage power supply ELVSS and that can turn off an organic EL element 35 (detailed later).

Referring to FIG. 4, the initialization TFT 9*a*, in each subpixel P, is electrically connected at the gate electrode thereof to a gate line 15*g*(*n*−1) of the preceding stage (n−1-th stage), at a third terminal electrode thereof to a lower conductive layer (detailed later) of the capacitor 9*h* and to the gate electrode of the drive TFT 9*d*, and at a fourth terminal electrode thereof to the power supply line 19*g*.

Referring to FIG. 4, the compensation TFT 9*b*, in each subpixel P, is electrically connected at the gate electrode thereof to a gate line 15*g*(*n*) of the current stage (n-th stage), at a third terminal electrode thereof to the gate electrode of the drive TFT 9*d*, and at a fourth terminal electrode thereof to a first terminal electrode of the drive TFT 9*d*.

Referring to FIG. 4, the write TFT 9*c*, in each subpixel P, is electrically connected at the gate electrode thereof to the gate line 15*g*(*n*) of the current stage (n-th stage), at the first terminal electrode thereof to an associated one of the source lines 19*f*, and at a second terminal electrode thereof to a second terminal electrode of the drive TFT 9*d*.

Referring to FIG. 4, the drive TFT 9*d*, in each subpixel P, is electrically connected at the gate electrode thereof to the third terminal electrodes of the initialization TFT 9*a* and the compensation TFT 9*b*, at the first terminal electrode thereof to the fourth terminal electrode of the compensation TFT 9*b* and to a second terminal electrode of the power supply TFT 9*e*, and at the second terminal electrode thereof to the second terminal electrode of the write TFT 9*c* and to a first terminal electrode of the light-emission control TFT 9*f*. Here, the drive TFT 9*d* is configured to control the electric current in the organic EL element 35.

Referring to FIG. 4, the power supply TFT 9*e*, in each subpixel P, is electrically connected at the gate electrode thereof to the light-emission control line 15*e* of the current stage (n-th stage), at a first terminal electrode thereof to the power supply line 19*g*, and at the second terminal electrode thereof to the first terminal electrode of the drive TFT 9*d*.

Referring to FIG. 4, the light-emission control TFT 9*f*, in each subpixel P, is electrically connected at the gate electrode thereof to the light-emission control line 15*e* of the current stage (n-th stage), at the first terminal electrode thereof to the second terminal electrode of the drive TFT 9*d*, and at a second terminal electrode thereof to a first electrode 31 (detailed later) of the organic EL element 35 (detailed later).

Referring to FIG. 4, the anode discharge TFT 9*g*, in each subpixel P, is electrically connected at the gate electrode thereof to the gate line 15*g*(*n*) of the current stage (n-th stage), at the third terminal electrode thereof to the first electrode 31 of the organic EL element 35, and at a fourth terminal electrode thereof to the second initialization power supply line 17*i*.

The capacitor 9*h* includes, for example: a lower conductive layer (not shown) made of the same material, and provided in the same layer, as the first gate electrode 15*a* and the second gate electrode 15*b*; the first interlayer insulating film 16 provided so as to cover the lower conductive layer; and an upper conductive layer (not shown) provided on the first interlayer insulating film 16 so as to overlap the lower conductive layer and made of the same material, and provided in the same layer, as the second initialization power supply line 17*i*. In addition, referring to FIG. 4, the capacitor 9*h*, in each subpixel P, is electrically connected at the lower conductive layer thereof to the gate electrode of the drive TFT 9*d* and also to the third terminal electrodes of the initialization TFT 9*a* and the compensation TFT 9*b* and at the upper conductive layer thereof to the third terminal electrode of the anode discharge TFT 9*g*, to the second terminal electrode of the light-emission control TFT 9*f*, and to the first electrode 31 of the organic EL element 35.

The planarization film 20 has a flat face in the display area D and is made of, for example, either an organic resin material, such as a polyimide resin or an acrylic resin, or a polysiloxane-based SOG (spin on glass) material.

Note that the present embodiment discusses, as an example, the TFT layer 30*a* in which the first semiconductor layer 12*a* and the first conductive layer 12*b* are separated from each other. Alternatively, the first TFT 9A and the second TFT 9B may have, in some parts thereof, a structure of the TFT layer 30*aa*, the TFT layer 30*ab*, and the TFT layer 30*ac* as shown in FIGS. 6, 7, and 8, respectively.

In a portion of the TFT layer 30*aa* where the second conductive region 12*ab* of the first TFT 9A and the first conductive layer 12*b* of the second TFT 9B are electrically connected, the first conductive layer 12*b* (see FIG. 3) of the second TFT 9B is formed integrally to the second conductive region 12*ab* of the first TFT 9A and omitted, as shown in FIG. 6. This TFT layer 30*aa* obviates the need for a space for contact holes, thereby enabling reducing the area occupied by TFTs in each subpixel and hence increasing freedom in designing high definition display devices.

Similarly to the TFT layer 30*aa*, in a portion of the TFT layer 30*ab* where the second conductive region 12*ab* of the first TFT 9A and the first conductive layer 12*b* of the second TFT 9B are electrically connected, the first conductive layer 12*b* (see FIG. 3) of the second TFT 9B is formed integrally to the second conductive region 12*ab* of the first TFT 9A and omitted, as shown in FIG. 7. Then, in the TFT layer 30*ab*, the second conductive region 12*ab* is provided longer for utilization ss a wiring line and electrically connected to the source line 19*f*, which has a lower electrical resistance. This TFT layer 30*ab* enables utilization of the second conductive region 12*ab* as a local wiring line, thereby facilitating wiring layout and hence improving the manufacturing yield.

Similarly to the TFT layer 30*aa*, in a portion of the TFT layer 30*ac* where the second conductive region 12*ab* of the first TFT 9A and the first conductive layer 12*b* of the second TFT 9B are electrically connected, the first conductive layer 12*b* (see FIG. 3) of the second TFT 9B is formed integrally to the second conductive region 12*ab* of the first TFT 9A and omitted, as shown in FIG. 8. Then, in the TFT layer 30*ac*, the third conductive region 13*aa* is provided longer for utilization as a wiring line and electrically connecting the second conductive region 12*ab* and the source line 19*f* that are in contact with the third conductive region 13*aa*. This TFT layer 30*ac* enables utilization of the third conductive region 13*aa* as a local wiring line, thereby facilitating wiring layout and improving the manufacturing yield.

Referring to FIG. 3, the organic EL element layer 40 includes: the plurality of organic EL elements 35, as a plurality of light-emitting elements, arranged in a matrix to correspond to the plurality of subpixels P; and an edge cover 32 arranged like a lattice commonly to all the subpixels P so as to cover a peripheral end portion of the first electrode 31 in each organic EL element 35.

Referring to FIG. 3, the organic EL element 35, in each subpixel P, includes: the first electrode 31 on the planarization film 20 of the TFT layer 30*a*; the organic EL layer 33 on the first electrode 31; and a second electrode 34 on the organic EL layer 33.

The first electrode 31 is electrically connected to the second terminal electrode of the light-emission control TFT 9*f* in each subpixel P via a contact hole formed through the planarization film 20. In addition, the first electrode 31 has a function of injecting holes to the organic EL layer 33. In addition, the first electrode 31 is more preferably made of a material having a large work function to improve the efficiency of hole injection to the organic EL layer 33. Here, the first electrode 31 may be made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). Alternatively, the first electrode 31 may be made of, for example, an alloy such as an astatine-astatine oxide ($At—AtO_2$) alloy. Furthermore, the first electrode 31 may be made of, for example, an electrically conductive oxide such as tin oxide (SnO), zinc oxide (ZnO), indium tin oxide (ITO), or indium zinc oxide (IZO). Alternatively, the first electrode 31 may include a stack of a plurality of layers of any of these materials. Note that examples of the compound material having a large work function include indium tin oxide (ITO) and indium zinc oxide (IZO).

Referring to FIG. 5, the organic EL layer 33 includes a hole injection layer 1, a hole transport layer 2, a light-emitting layer 3, an electron transport layer 4, and an electron injection layer 5, which are sequentially provided on the first electrode 31.

The hole injection layer 1 is alternatively referred to as the anode buffer layer and has a function of bringing the energy levels of the first electrode 31 and the organic EL layer 33 close to each other, to improve the efficiency of hole injection from the first electrode 31 to the organic EL layer 33. Here, the hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styrylanthracene derivative, a fluorenone derivative, a hydrazone derivative, or a stilbene derivative.

The hole transport layer 2 has a function of improving the efficiency of hole transport from the first electrode 31 to the organic EL layer 33. Here, the hole transport layer 2 is made of, for example, a porphyrin derivative, an aromatic tertiary amine compound, a styryl amine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styrylanthracene derivative, a fluorenone derivative, a hydrazone derivative, a stilbene derivative, a hydrogenated amorphous silicon, a hydrogenated amorphous silicon carbide, zinc sulfide, or zinc selenide.

The light-emitting layer 3 is injected with holes and electrons from the first electrode 31 and the second electrode 34 respectively when the light-emitting layer 3 is under a voltage applied by the first electrode 31 and the second electrode 34. These holes and electrons recombine in the light-emitting layer 3. Here, the light-emitting layer 3 is made of a material that has a high luminous efficiency. Then, the light-emitting layer 3 is made of, for example, a metal oxinoid compound [8-hydroxy quinoline metal complex], a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styryl amine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 has a function of efficiently transporting electrons to the light-emitting layer 3. Here, the electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 34 and the organic EL layer 33 clos to each other, to improve the efficiency of electron injection from the second electrode 34 to the organic EL layer 33. This function enables lowering the drive voltage of the organic EL element 35. Note that the electron injection layer 5 is alternatively referred to as the cathode buffer layer. Here, the electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$), aluminum oxide ($Al_2O_3$), or strontium oxide (SrO).

Referring to FIG. 3, the second electrode 34 is provided commonly to all the subpixels P so as to cover the organic EL layers 33 and the edge cover 32. In addition, the second electrode 34 has a function of injecting electrons to the organic EL layer 33. In addition, the second electrode 34 is more preferably made of a material that has a small work function to improve the efficiency of electron injection to the organic EL layer 33. Here, the second electrode 34 is made of, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF). Alternatively, the second electrode 34 may be made of, for example, an alloy such as a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. Alternatively, the second electrode 34 may be made of, for example, an electrically conductive oxide such as tin oxide (SnO), zinc oxide (ZnO), indium tin oxide (ITO), or indium zinc oxide (IZO). In addition, the second electrode 34 may include a stack of layers of any of these materials. Note that examples of the material that has a small work function include magnesium (Mg), lithium (Li), lithium fluoride (LiF), a magnesium-copper (Mg—Cu) alloy, a magnesium-silver (Mg—Ag) alloy, a sodium-potassium (Na—K) alloy, a lithium-aluminum (Li—Al) alloy, a lithium-calcium-aluminum (Li—Ca—Al) alloy, and a lithium fluoride-calcium-aluminum (LiF—Ca—Al) alloy.

The edge cover 32 is made of, for example, either an organic resin material, such as a polyimide resin or an acrylic resin, or a polysiloxane-based SOG material.

Referring to FIG. 3, the sealing film 45 covers the second electrode 34, includes a first inorganic sealing film 41, an organic sealing film 42, and a second inorganic sealing film 43, which are sequentially stacked on the second electrode 34, and has a function of protecting the organic EL layer 33 in the organic EL element layer 35 from, for example, water and oxygen.

The first inorganic sealing film 41 and the second inorganic sealing film 43 include, for example, an inorganic insulating film such as a silicon nitride film, a silicon oxide film, or a silicon oxynitride film.

The organic sealing film 42 contains, for example, an organic resin material such as an acrylic resin, an epoxy resin, a silicone resin, a polyurea resin, a parylene resin, a polyimide resin, or a polyamide resin.

In the organic EL display device 50 structured as above, in each subpixel P, first of all, as the light-emission control line 15*e* is selected and deactivated, the organic EL element 35 is turned into a non-emissive state. In that non-emissive state, the gate line 15*g*($n$−1) of the preceding stage is selected to feed a gate signal to the initialization TFT 9*a* via the gate line 15g(n−1), which turns on the initialization TFT 9a. Accordingly, the high-voltage power supply ELVDD on the power supply line 19g is applied to the capacitor 9h, and the drive TFT 9d is turned on. Hence, the capacitor 9h discharges, initializing voltage across the gate electrode of the drive TFT 9d. Next, as the gate line 15g(n) of the current stage is selected and activated, the compensation TFT 9b and the write TFT 9c are turned on, and a prescribed voltage corresponding to the source signal transferred via the corresponding source line 19f is written to the capacitor 9h via the diode-connected drive TFT 9d. Furthermore, the anode discharge TFT 9g is turned on, so that an initialization signal is applied to the first electrode 31 of the organic EL element 35 via the second initialization power supply line 17i, thereby resetting the electric charge stored in the first electrode 31. Thereafter, the light-emission control line 15e is selected to turn on the power supply TFT 9e and the light-emission control TFT 9f, thereby feeding a drive current in accordance with a voltage across the gate electrode of the drive TFT 9d from the power supply line 19g to the organic EL element 35. In this manner, in each subpixel P in the organic EL display device 50, the organic EL element 35 emits light with a luminance that is in accordance with the drive current to produce an image display.

Next, a description is given of a method of manufacturing the organic EL display device 50 in accordance with the present embodiment. The method of manufacturing the organic EL display device 50 includes a TFT layer formation step, an organic EL element layer formation step, and a sealing film formation step. Here, FIGS. 9, 10, 11, 12, 13, 14, 15, 16, 17, and 18 are a first, a second, a third, a fourth, a fifth, a sixth, a seventh, an eighth, a ninth, and a tenth cross-sectional view of a successive part of the TFT layer formation step of the method of manufacturing an organic EL display device.

TFT Layer Formation Step

First, the base coat film 11 is formed by sequentially forming a silicon nitride film (approximately 50 nm) and a silicon oxide film (to a thickness of approximately 250 nm) by, for example, plasma CVD (chemical vapor deposition) on, for example, the resin substrate layer 10 formed on a glass substrate.

Figure 9:
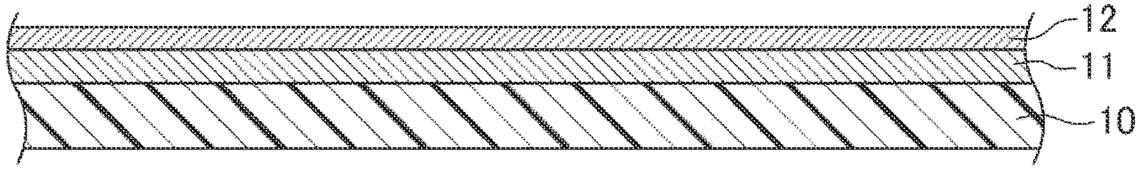
FIG. 9 is a first cross-sectional view of a part of the manufacture of the organic EL display device in accordance with the first embodiment of the disclosure.
Figure 10:
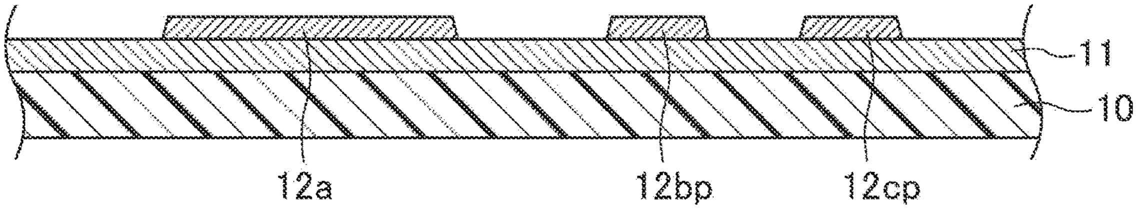
FIG. 10 is a second cross-sectional view, which follows FIG. 9, of a part of the manufacture of the organic EL display device in accordance with the first embodiment of the disclosure.

Subsequently, an amorphous silicon film (having a thickness of approximately 50 nm) is formed by, for example, plasma CVD on the substrate on which the base coat film 11 has been formed, and the amorphous silicon film is then crystallized by, for example, laser annealing to form a polysilicon film 12, as shown in FIG. 9. Thereafter, the polysilicon film 12 is patterned to form the first semiconductor layer 12a, a first polysilicon layer 12bp, and a second polysilicon layer 12cp as shown in FIG. 10 (first semiconductor layer formation step).

Figure 11:
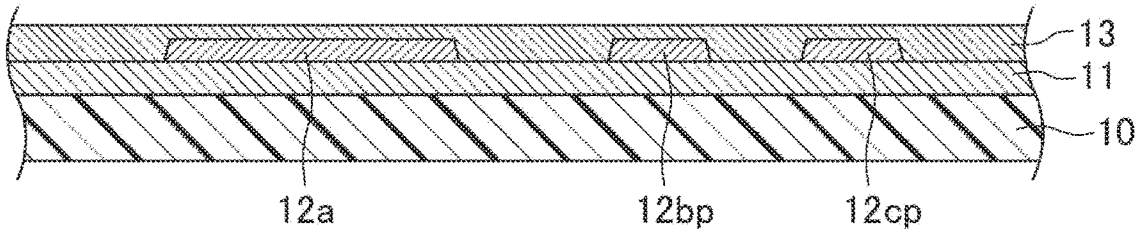
FIG. 11 is a third cross-sectional view, which follows FIG. 10, of a part of the manufacture of the organic EL display device in accordance with the first embodiment of the disclosure.
Figure 12:
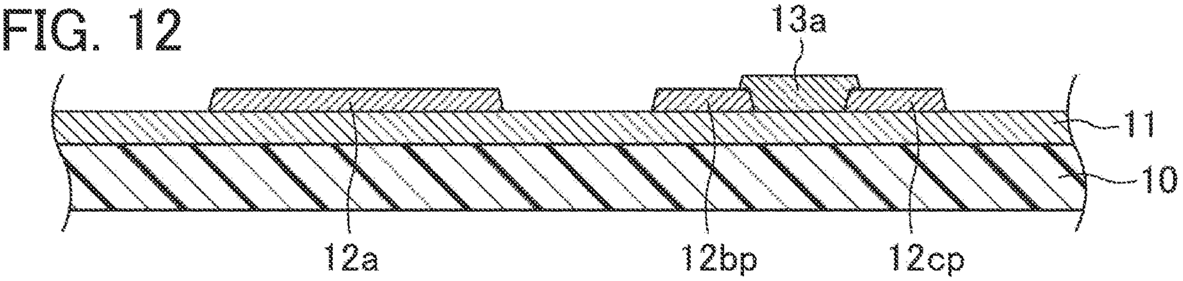
FIG. 12 is a fourth cross-sectional view, which follows FIG. 11, of a part of the manufacture of the organic EL display device in accordance with the first embodiment of the disclosure.

Furthermore, referring to FIG. 11, an oxide semiconductor film 13 of, for example, $InGaZnO_4$ is formed (to a thickness of approximately 30 nm) by, for example, sputtering on the surface of the substrate on which the first semiconductor layer 12a, the first polysilicon layer 12bp, and the second polysilicon layer 12cp have been formed. Thereafter, the second semiconductor layer 13a is formed by patterning the oxide semiconductor film 13 as shown in FIG. 12 (second semiconductor layer formation step). Note that the film quality of the oxide semiconductor may be improved by annealing after the second semiconductor layer 13a is formed.

Figure 13:
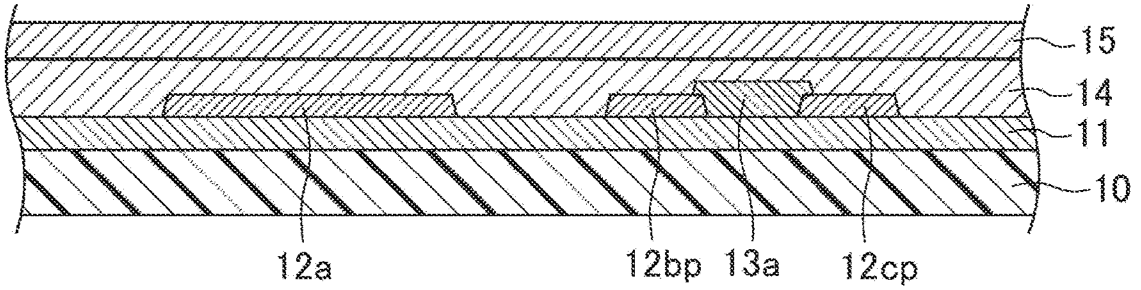
FIG. 13 is a fifth cross-sectional view, which follows FIG. 12, of a part of the manufacture of the organic EL display device in accordance with the first embodiment of the disclosure.
Figure 14:
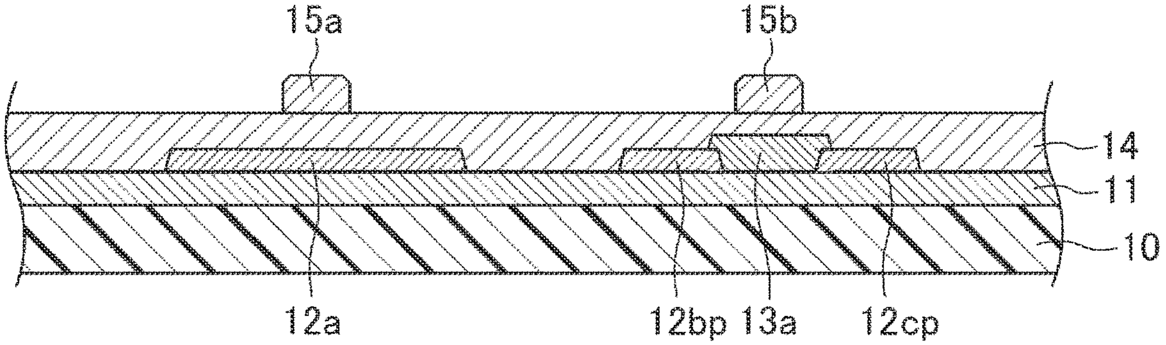
FIG. 14 is a sixth cross-sectional view, which follows FIG. 13, of a part of the manufacture of the organic EL display device in accordance with the first embodiment of the disclosure.

Subsequently, as silicon oxide film is formed (to a thickness of approximately 100 nm) by, for example, plasma CVD on the surface of the substrate on which the second semiconductor layer 13a has been formed, to form the gate insulating film 14, as shown in FIG. 13. Thereafter, a metal film 15 such as a molybdenum film is formed (to a thickness of approximately 200 nm) by, for example, sputtering (gate insulating film formation step). Thereafter, the metal film 15 is patterned to form the first gate electrode 15a and the second gate electrode 15b as shown in FIG. 14 (gate electrode formation step). Note that the gate lines 15g and the light-emission control lines 15e are also formed in forming the first gate electrode 15a and the second gate electrode 15b.

Figure 15:
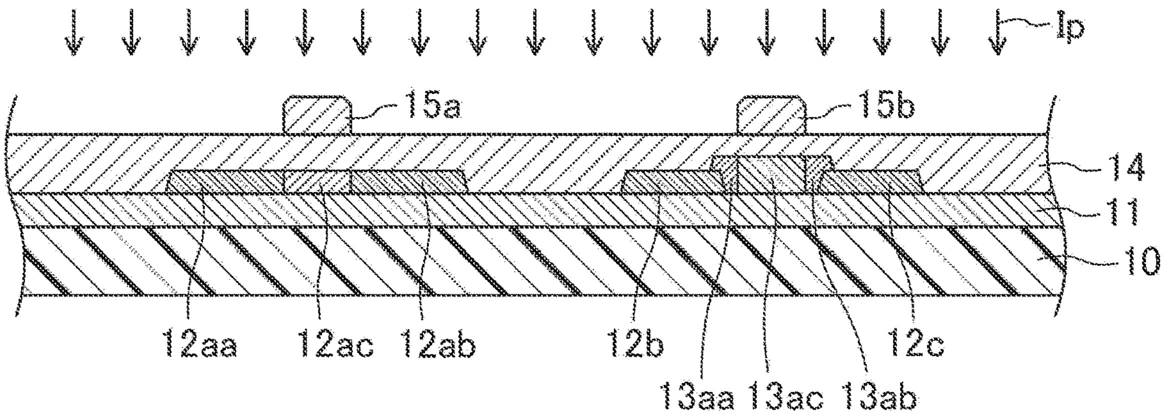
FIG. 15 is a seventh cross-sectional view, which follows FIG. 14, of a part of the manufacture of the organic EL display device in accordance with the first embodiment of the disclosure.

Furthermore, the first conductive region 12aa, the second conductive region 12ab, and the first channel region 12ac are formed in the first semiconductor layer 12a, and the third conductive region 13aa, the fourth conductive region 13ab, and the second channel region 13ac are formed in the second semiconductor layer 13a, by doping with impurity ions Ip of, for example, phosphorus using the first gate electrode 15a and the second gate electrode 15b as a mask as shown in FIG. 15. The first polysilicon layer 12bp and the second polysilicon layer 12cp are then modified into a conductor to form the first conductive layer 12b and the second conductive layer 12c (ion doping step). Note that after the doping with the impurity ions Ip, the polysilicon may be subjected to activation by annealing.

Thereafter, a silicon oxide film is formed (to a thickness of approximately 300 nm) by, for example, plasma CVD on the surface of the substrate on which the first conductive region 12aa, the second conductive region 12ab, the first channel region 12ac, the third conductive region 13aa, the fourth conductive region 13ab, the second channel region 13ac, the first conductive layer 12b, and the second conductive layer 12c have been formed, to form the first interlayer insulating film 16.

Subsequently, a metal film such as a molybdenum film is formed (to a thickness of approximately 200 nm) by, for example, sputtering on the surface of the substrate on which the first interlayer insulating film 16 has been formed. Thereafter, the metal film is patterned to form, for example, the second initialization power supply lines 17i.

Figure 16:
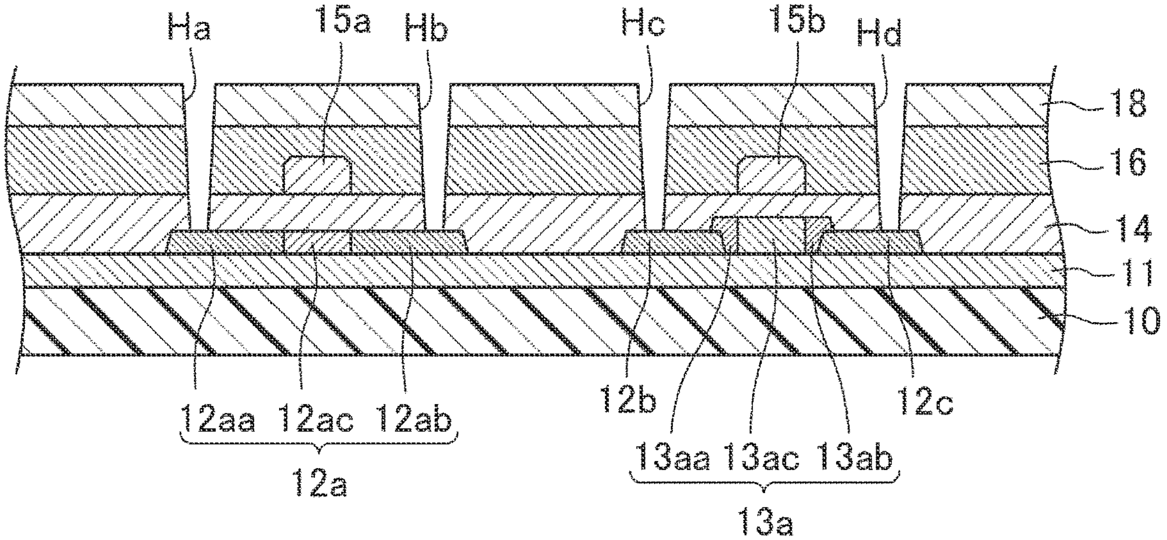
FIG. 16 is an eighth cross-sectional view, which follows FIG. 15, of a part of the manufacture of the organic EL display device in accordance with the first embodiment of the disclosure.

Furthermore, the second interlayer insulating film 18 is formed by forming a silicon nitride film (to a thickness of approximately 150 nm) by, for example, plasma CVD on the surface of the substrate on which, for example, the second initialization power supply lines 17i has been formed. Thereafter, a stack of the gate insulating film 14, the first interlayer insulating film 16, and the second interlayer insulating film 18 is patterned by sequentially performing dry etching using, for example, $CF_4$ and $SF_6$ and wet etching using, for example, hydrofluoric acid, to form, for example, the first contact hole Ha, the second contact hole Hb, the third contact hole Hc, and the fourth contact hole Hd, as shown in FIG. 16 (interlayer insulating film formation step).

Figure 17:
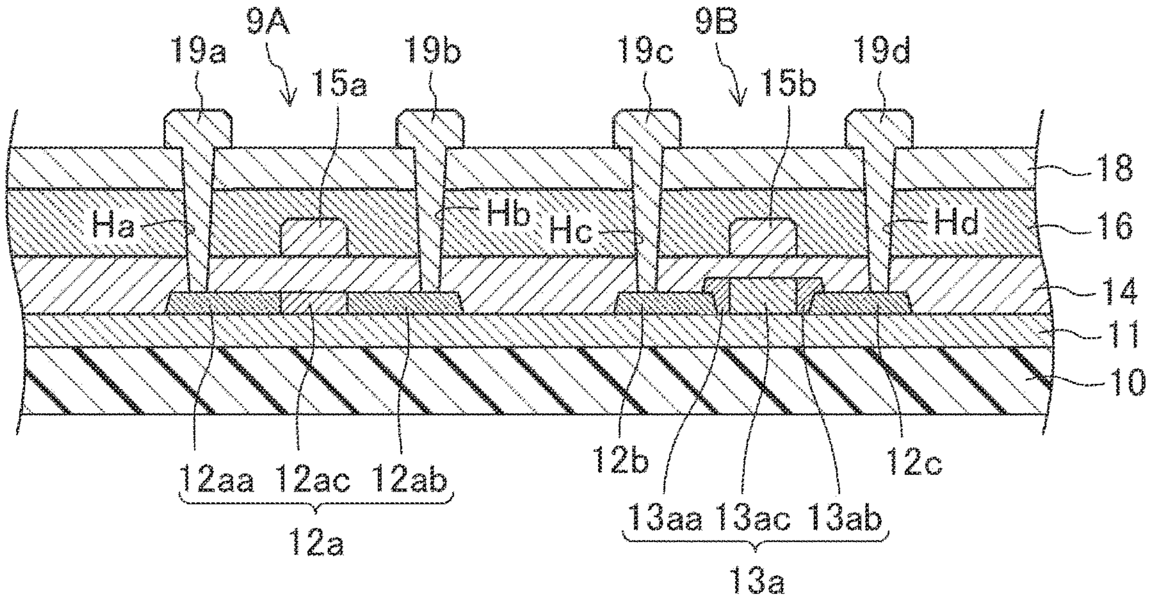
FIG. 17 is a ninth cross-sectional view, which follows FIG. 16, of a part of the manufacture of the organic EL display device in accordance with the first embodiment of the disclosure.

Thereafter, for example, a titanium film (having a thickness of approximately 50 nm), an aluminum film (having a thickness of approximately 400 nm), and a titanium film (having a thickness of approximately 50 nm) are sequentially formed by, for example, sputtering on the surface of the substrate on which, for example, the first contact hole Ha, the second contact hole Hb, the third contact hole Hc, and the fourth contact hole Hd have been formed. Thereafter, the metal stack-layer film is patterned to form the first terminal electrode 19a, the second terminal electrode 19b, the third terminal electrode 19c, and the fourth terminal electrode 19d as shown in FIG. 17 (terminal electrode formation step). Note that the source lines 19f and the power supply lines 19g are also formed in forming the first terminal electrode 19_a_, the second terminal electrode 19_b_, the third terminal electrode 19_c_, and the fourth terminal electrode 19_d_.

Figure 18:
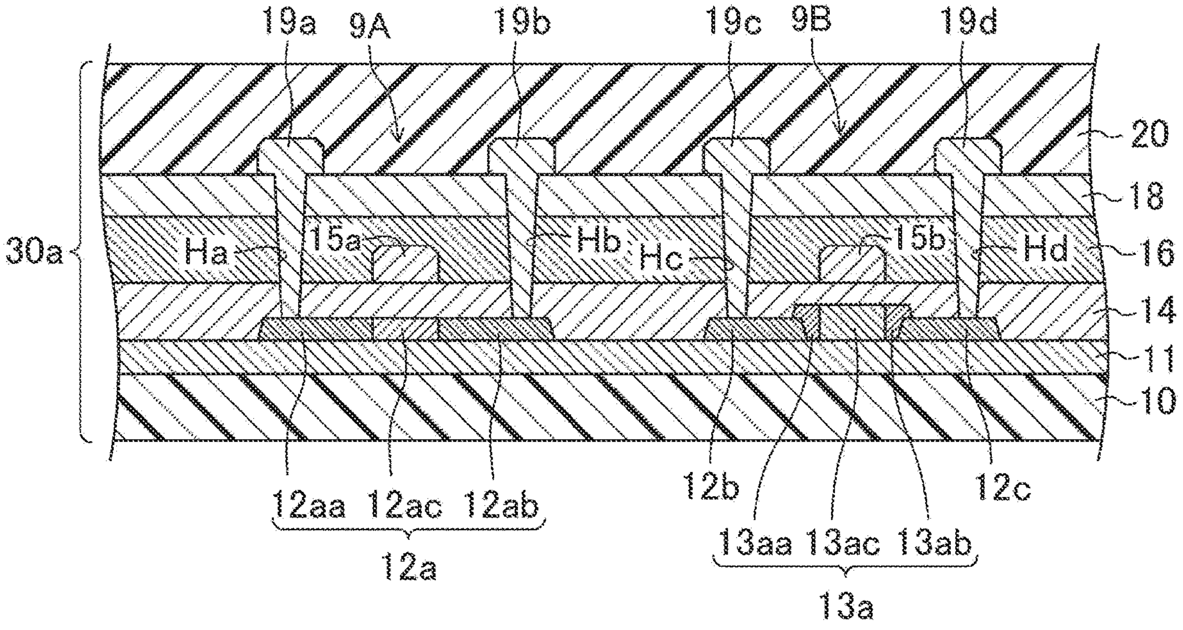
FIG. 18 is a tenth cross-sectional view, which follows FIG. 17, of a part of the manufacture of the organic EL display device in accordance with the first embodiment of the disclosure.

Finally, a polyimide-based photosensitive resin film (having a thickness of approximately 2 μm) is applied by, for example, spin-coating or slit-coating on the surface of the substrate on which, for example, the first terminal electrode 19_a_, the second terminal electrode 19_b_, the third terminal electrode 19_c_, and the fourth terminal electrode 19_d_ have been formed. Thereafter, the coating film is pre-baking, exposed to light, developed, and post-baked to form the planarization film 20, as shown in FIG. 18 (planarization film formation step).

The TFT layer 30_a_ is formed as described above.

Organic EL Element Layer Formation Step (Light-emitting Element Layer Formation Step)

The first electrode 31, the edge cover 32, the organic EL layer 33 (the hole injection layer 1, the hole transport layer 2, the light-emitting layer 3, the electron transport layer 4, and the electron injection layer 5), and the second electrode 34 are formed by a well-known method on the planarization film 20 of the TFT layer 30_a_ formed in the aforementioned TFT layer formation step, to form the organic EL element layer 40.

Sealing Film Formation Step

First, an inorganic insulating film such as a silicon nitride film, a silicon oxide film, or a silicon oxynitride film is formed by plasma CVD using a mask on the surface of the substrate on which the organic EL element layer 40 has been formed in the aforementioned organic EL element layer formation step, to form the first inorganic sealing film 41.

Subsequently, a film is formed of an organic resin material such as an acrylic resin by, for example, inkjet printing technology on the surface of the substrate on which the first inorganic sealing film 41 has been formed, to form the organic sealing film 42.

Thereafter, an inorganic insulating film such as a silicon nitride film, a silicon oxide film, or a silicon oxynitride film is formed by plasma CVD using a mask on the surface of the substrate on which the organic sealing film 42 has been formed, to form the second inorganic sealing film 43 to form the sealing film 45.

Finally, a protection sheet (not shown) is attached to the surface of the substrate on which the sealing film 45 has been formed, thereafter a laser beam is projected from the glass substrate side of the resin substrate layer 10, to lift off the glass substrate from the bottom face of the resin substrate layer 10, and a protection sheet (not shown) is attached to the bottom face of the resin substrate layer 10 from which the glass substrate has been lifted off.

The organic EL display device 50 in accordance with the present embodiment is manufactured as described above.

As described above, according to the organic EL display device 50 in accordance with the present embodiment and the method of manufacturing the organic EL display device 50, the first semiconductor layer 12_a_, the first polysilicon layer 12_bp_, and the second polysilicon layer 12_cp_ are formed of a polysilicon in the first semiconductor layer formation step, and the second semiconductor layer 13_a_ is formed of an oxide semiconductor on the first polysilicon layer 12_bp_ and the second polysilicon layer 12_cp_ in the second semiconductor layer formation step. Thereafter, in the ion doping step, the first conductive region 12_aa_ and the second conductive region 12_ab_, both of which are of a n' type, are formed in the first semiconductor layer 12_a_ by doping the first semiconductor layer 12_a_, the first polysilicon layer 12_bp_, and the second polysilicon layer 12_cp_ with the impurity ions Ip, the first conductive layer 12_b_ and the second conductive layer 12_c_, both of which are of a $n^+$ type, are formed by modifying the first polysilicon layer 12_bp_ and the second polysilicon layer 12_cp_ into a conductor, and the third conductive region 13_aa_ and the fourth conductive region 13_ab_ are formed in the second semiconductor layer 13_a_ by doping the second semiconductor layer 13_a_ with the impurity ions Ip. Furthermore, in the interlayer insulating film formation step, the first contact hole Ha, the second contact hole Hb, the third contact hole Hc, and the fourth contact hole Hd are formed through a stack of the gate insulating film 14, the first interlayer insulating film 16, and the second interlayer insulating film 18, reaching the first conductive region 12_aa_, the second conductive region 12_ab_, the first conductive layer 12_b_, and the second conductive layer 12_c_. Here, the third contact hole Hc and the fourth contact hole Hd are formed so as to reach the first conductive layer 12_b_ and the second conductive layer 12_c_, which are made of a polysilicon that is poorly dissolvable in hydrofluoric acid and which are modified into a conductor, not to reach the third conductive region 13_aa_ and the fourth conductive region 13_ab_, which are made of an oxide semiconductor that is readily dissolvable in hydrofluoric acid. Therefore, the first contact hole Ha, the second contact hole Hb, the third contact hole Hc, and the fourth contact hole Hd can be collectively formed. In addition, in doping the first semiconductor layer 12_a_ and the second semiconductor layer 13_a_ with the impurity ions Ip using the first gate electrode 15_a_ and the second gate electrode 15_b_ as a mask in the ion doping step, only the gate insulating film 14 is disposed between the first semiconductor layer 12_a_ and the first gate electrode 15_a_ (serving as a mask for the first semiconductor layer 12_a_) and between the second semiconductor layer 13_a_ and the second gate electrode 15_b_ (serving as a mask for the second semiconductor layer 13_a_). Therefore, the first semiconductor layer 12_a_ and the second semiconductor layer 13_a_ can be simultaneously doped with the impurity ions Ip. Therefore, it is possible to collectively form the first contact hole Ha and the second contact hole Hb for electrically connecting to the first semiconductor layer 12_a_ of a polysilicon and to form the third contact hole Hc and the fourth contact hole Hd for electrically connecting to the semiconductor layer 13_a_ of an oxide semiconductor and also to simultaneously perform ion doping on the first semiconductor layer 12_a_ and the second semiconductor layer 13_a_.

Second Embodiment

Figure 19:
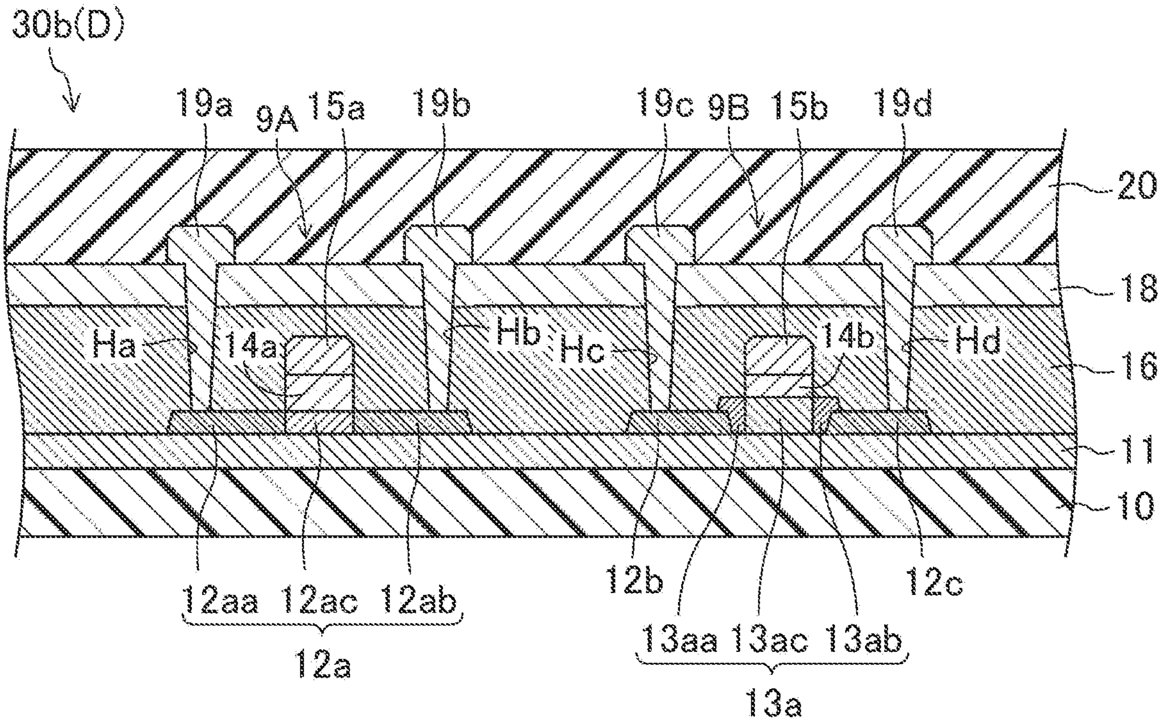
FIG. 19 is a cross-sectional view of a display area of a TFT layer that is a part of an organic EL display device in accordance with a second embodiment of the disclosure.

FIG. 19 illustrates a second embodiment of a display device and a method of manufacturing a display device, both in accordance with the disclosure. Here, FIG. 19 is a cross-sectional view of a display area D of a TFT layer 30_b_ that is a part of an organic EL display device in accordance with the present embodiment. Note that members of this and subsequent embodiments that are the same as those shown in FIGS. 1 to 18 are indicated by the same reference signs or numerals, and detailed description thereof is omitted.

The first embodiment above discusses an example where the organic EL display device 50 includes the TFT layer 30_a_ including the gate insulating film 14 provided as a common layer. Meanwhile, the present embodiment discusses an example where an organic EL display device includes the TFT layer 30_b_ including insular, first gate insulating films 14_a_ and insular, second gate insulating films 14_b_.

Similarly to the organic EL display device 50 in accordance with the first embodiment above, the organic EL display device in accordance with the present embodiment includes, for example, the rectangular display area D and the frame area F surrounding the display area D.

The organic EL display device in accordance with the present embodiment includes: a resin substrate layer 10; the TFT layer 30*b* on the resin substrate layer 10; an organic EL element layer 40 on the TFT layer 30*b*; and a sealing film 45 covering the organic EL element layer 40.

Referring to FIG. 19, similarly to the TFT layer 30*a* in accordance with the first embodiment above, the TFT layer 30*b* includes: a base coat film 11 on the resin substrate layer 10; four first TFTs 9A, three second TFTs 9B, and one capacitor 9*h* (see FIG. 4), all on the base coat film 11, in each subpixel P; and a planarization film 20 on the first TFTs 9A, the second TFTs 9B, and the capacitors 9*h*. Here, similarly to the TFT layer 30*a* in accordance with the first embodiment above, the TFT layer 30*b* includes: a plurality of gate lines 15*g*; a plurality of light-emission control lines 15*e*; a plurality of second initialization power supply lines 17*i*; a plurality of source lines 19*f*; and a plurality of power supply lines 19*g*.

Referring to FIG. 19, each first TFT 9A includes: a first semiconductor layer 12*a* on the base coat film 11; one of the insular, first gate insulating films 14*a* on the first channel region 12*ac* of the first semiconductor layer 12*a*; a first gate electrode 15*a* on the first gate insulating film 14*a*; a first interlayer insulating film 16 and a second interlayer insulating film 18 sequentially provided so as to cover the first gate electrode 15*a*; and a first terminal electrode 19*a* and a second terminal electrode 19*b* on the second interlayer insulating film 18 at a distance from each other. Here, referring to FIG. 19, the first terminal electrode 19*a* and the second terminal electrode 19*b* are electrically connected respectively to the first conductive region 12*aa* and the second conductive region 12*ab* of the first semiconductor layer 12*a* via a first contact hole Ha and a second contact hole Hb formed through a stack of the first interlayer insulating film 16 and the second interlayer insulating film 18. Note that referring to FIG. 19, the first gate insulating film 14*a* is provided insularly so as to overlap the first gate electrode 15*a*.

Referring to FIG. 19, each second TFT 9B includes: a second semiconductor layer 13*a* on the base coat film 11; a first conductive layer 12*b* and a second conductive layer 12*c* on the resin substrate layer 10 side of the third conductive region 13*aa* and the fourth conductive region 13*ab* of the second semiconductor layer 13*a* respectively; the insular, second gate insulating film 14*b* on the second channel region 13*ac* of the second semiconductor layer 13*a*; a second gate electrode 15*b* on the second gate insulating film 14*b*; the first interlayer insulating film 16 and the second interlayer insulating film 18 sequentially provided so as to cover the second gate electrode 15*b*; and the third terminal electrode 19*c* and the fourth terminal electrode 19*d* on the second interlayer insulating film 18 at a distance from each other. Here, referring to FIG. 19, the third terminal electrode 19*c* and the fourth terminal electrode 19*d* are electrically connected respectively to the first conductive layer 12*b* and the second conductive layer 12*c* via a third contact hole Hc and a fourth contact hole Hd formed through the stack of the first interlayer insulating film 16 and the second interlayer insulating film 18. Note that referring to FIG. 19, the second gate insulating film 14*b* is provided insularly so as to overlap the second gate electrode 15*b* and made of the same material, and provided in the same layer, as the first gate insulating film 14*a*.

Similarly to the organic EL display device 50 in accordance with the first embodiment above, in each subpixel P in the organic EL display device in accordance with the present embodiment, the organic EL element 35 emits light with a luminance that is in accordance with the drive current to produce an image display.

The organic EL display device in accordance with the present embodiment can be manufactured by also patterning the gate insulating films 14 underlying the first gate electrode 15*a* and the second gate electrode 15*b* simultaneously with the formation of the first gate electrode 15*a* and the second gate electrode 15*b* in the gate electrode formation step in the TFT layer formation step in the method of manufacturing the organic EL display device 50 in accordance with the first embodiment above.

As described above, according to the organic EL display device in accordance with the present embodiment and the method of manufacturing the organic EL display device, the first semiconductor layer 12*a*, the first polysilicon layer 12*bp*, and the second polysilicon layer 12*cp* are formed of a polysilicon in the first semiconductor layer formation step, and the second semiconductor layer 13*a* is formed of an oxide semiconductor on the first polysilicon layer 12*bp* and the second polysilicon layer 12*cp* in the second semiconductor layer formation step. Thereafter, in the ion doping step, the first conductive region 12*aa* and the second conductive region 12*ab*, both of which are of a $n^+$ type, are formed in the first semiconductor layer 12*a* by doping the first semiconductor layer 12*a*, the first polysilicon layer 12*bp*, and the second polysilicon layer 12*cp* with the impurity ions Ip, the first conductive layer 12*b* and the second conductive layer 12*c* are formed by modifying the first polysilicon layer 12*bp* and the second polysilicon layer 12*cp* into a conductor, and the third conductive region 13*aa* and the fourth conductive region 13*ab* are formed in the second semiconductor layer 13*a* by doping the second semiconductor layer 13*a* with the impurity ions Ip. Furthermore, in the interlayer insulating film formation step, the first contact hole Ha, the second contact hole Hb, the third contact hole Hc, and the fourth contact hole Hd are formed through a stack of the first interlayer insulating film 16 and the second interlayer insulating film 18, reaching the first conductive region 12*aa*, the second conductive region 12*ab*, the first conductive layer 12*b*, and the second conductive layer 12*c*. Here, the third contact hole Hc and the fourth contact hole Hd are formed so as to reach the first conductive layer 12*b* and the second conductive layer 12*c*, which are made of a polysilicon that is poorly dissolvable in hydrofluoric acid and which are modified into a conductor, not to reach the third conductive region 13*aa* and the fourth conductive region 13*ab*, which are made of an oxide semiconductor that is readily dissolvable in hydrofluoric acid. Therefore, the first contact hole Ha, the second contact hole Hb, the third contact hole Hc, and the fourth contact hole Hd can be collectively formed. In addition, in doping the first semiconductor layer 12*a* and the second semiconductor layer 13*a* with the impurity ions Ip using the first gate electrode 15*a* and the second gate electrode 15*b* as a mask in the ion doping step, only the first gate insulating film 14*a* and the second gate insulating film 14*b* are disposed between the first semiconductor layer 12*a* and the first gate electrode 15*a* (serving as a mask for the first semiconductor layer 12*a*) and between the second semiconductor layer 13*a* and the second gate electrode 15*b* (serving as a mask for the second gate electrode 15*b*). Therefore, the first semiconductor layer 12*a* and the second semiconductor layer 13*a* can be simultaneously doped with the impurity ions Ip. Therefore, it is possible to collectively form the first contact hole Ha and the second contact hole Hb for electrically connecting to the first semiconductor layer 12*a* of a polysilicon and to form the third contact hole Hc and the fourth contact hole Hd for electrically connecting to the semiconductor layer 13*a* of an oxide semiconductor and also to simultaneously perform ion doping on the first semiconductor layer 12*a* and the second semiconductor layer 13*a*.

In addition, according to the organic EL display device in accordance with the present embodiment and the method of manufacturing the organic EL display device, doping the first semiconductor layer 12*a* and the second semiconductor layer 13*a* with the impurity ions Ip in the ion doping step, since the regions that will become the first conductive region 12*aa*, the second conductive region 12*ab*, the first conductive layer 12*b*, the second conductive layer 12*c*, the third conductive region 13*aa*, and the fourth conductive region 13*ab* are exposed from the first gate insulating film 14*a* and the second gate insulating film 14*b*, the doping with the impurity ions Ip can be efficiently done, which enables restraining manufacturing cost.

Third Embodiment

Figure 20:
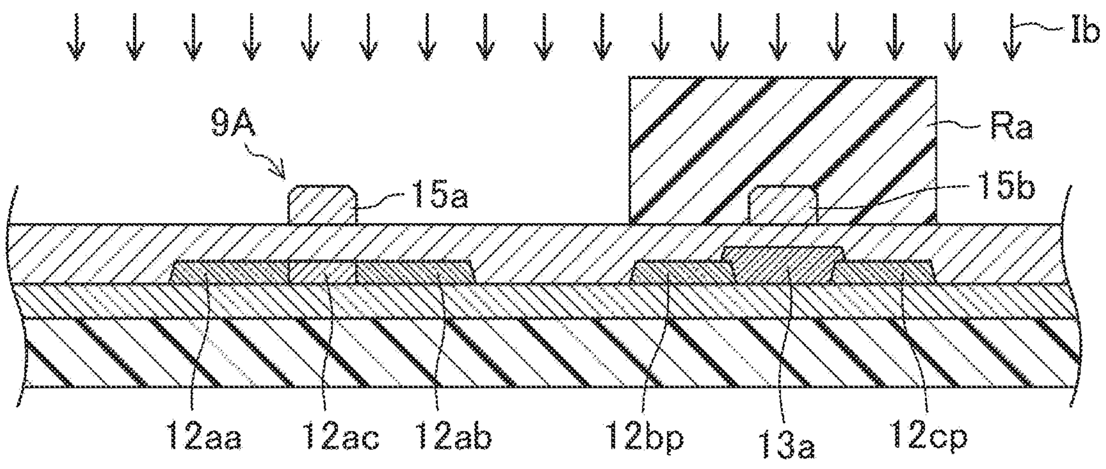
FIG. 20 is a first cross-sectional view of a part of the manufacture of an organic EL display device in accordance with a third embodiment of the disclosure.
Figure 21:
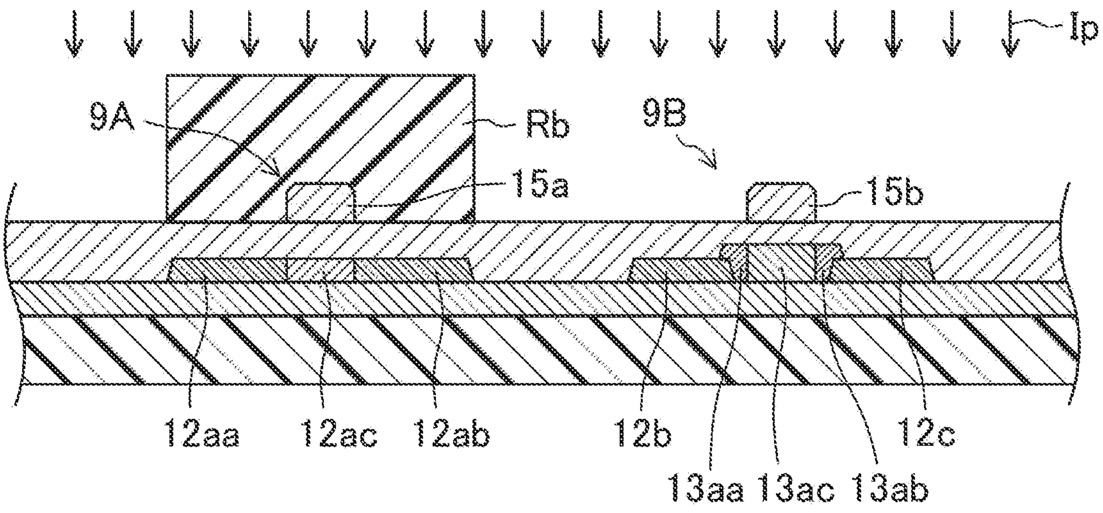
FIG. 21 is a second cross-sectional view, which follows FIG. 20, of a part of the manufacture of the organic EL display device in accordance with the third embodiment of the disclosure.
Figure 22:
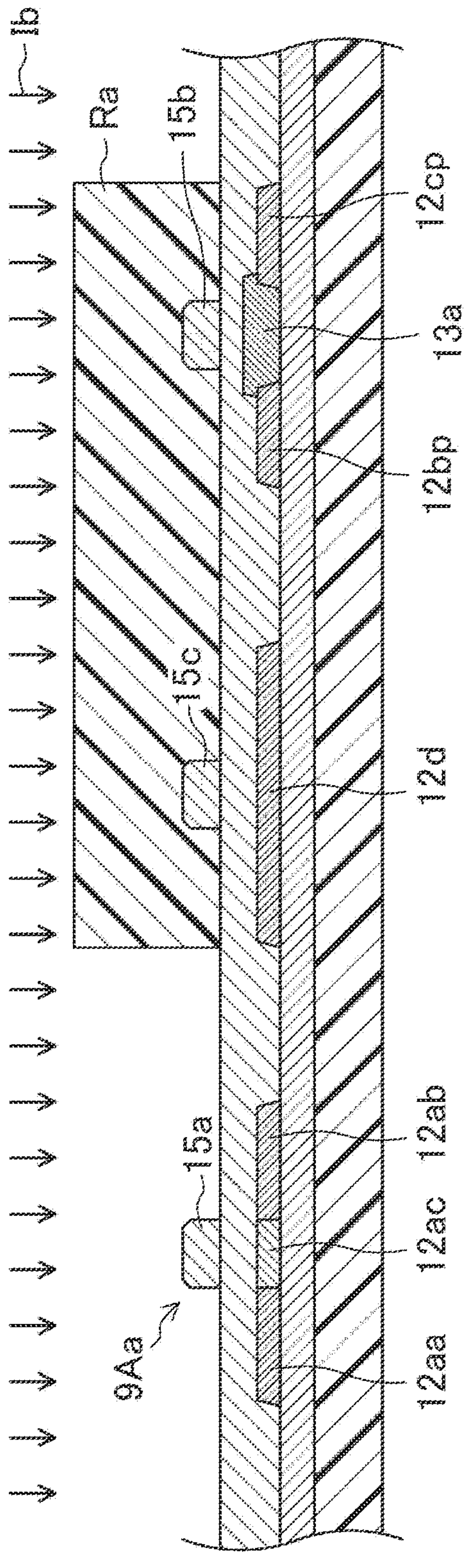
FIG. 22 is a first cross-sectional view of a part of the manufacture of a variation example of the organic EL display device in accordance with the third embodiment of the disclosure.
Figure 23:
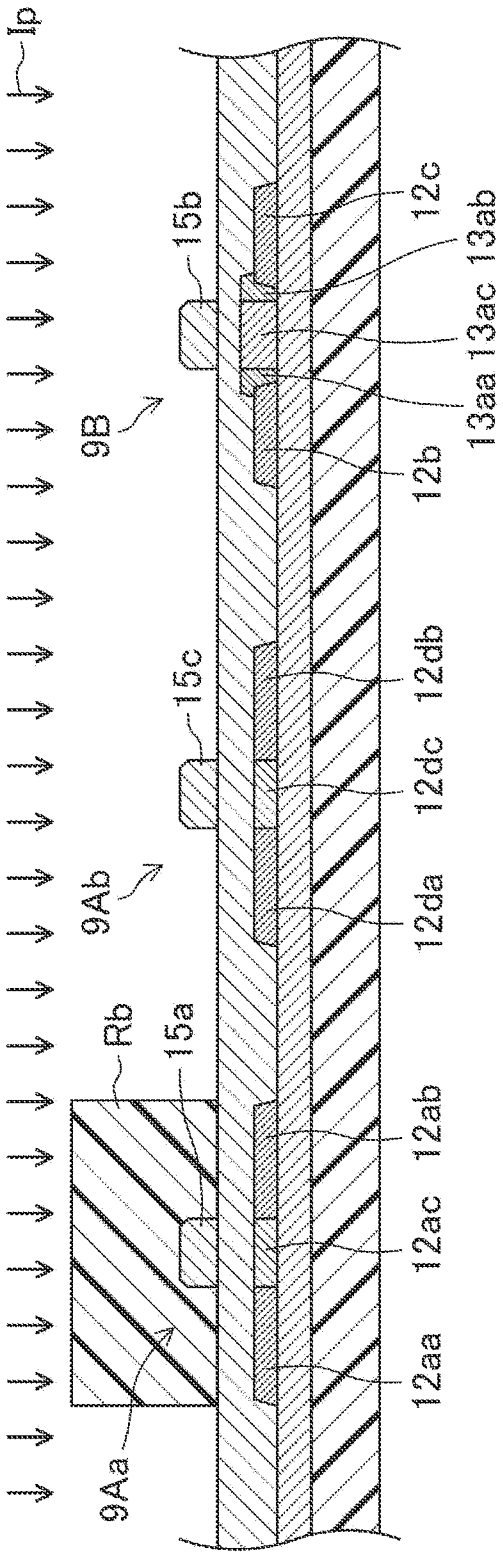
FIG. 23 is a second cross-sectional view, which follows FIG. 22, of a part of the manufacture of the variation example of the organic EL display device in accordance with the third embodiment of the disclosure.

FIGS. 20 to 23 illustrate a third embodiment of a display device and a method of manufacturing a display device, both in accordance with the disclosure. FIG. 20 is a first cross-sectional view of a part of the manufacture of the organic EL display device in accordance with the present embodiment. FIG. 21 is a second cross-sectional view that follows FIG. 20. In addition, FIG. 22 is a first cross-sectional view of a part of the manufacture of a variation example of the organic EL display device in accordance with the present embodiment. FIG. 23 is a second cross-sectional view that follows FIG. 22.

The first embodiment above discusses an example where the method of manufacturing the organic EL display device involves doping with phosphorus as impurity ions. Meanwhile, the present embodiment discusses an example where the method of manufacturing the organic EL display device involves doping with phosphorus and boron as impurity ions.

Specifically, in the ion doping step in the TFT layer formation step described in the first embodiment above, first of all, a resist Ra is formed so as to cover the second gate electrode 15*b*, and thereafter doping with impurity ions Ib such as boron is performed using the first gate electrode 15*a* as a mask, to form the first conductive region 12*aa*, the second conductive region 12*ab*, and the first channel region 12*ac* in the first semiconductor layer 12*a* as shown in FIG. 20. Subsequently, the resist Ra is removed, and a resist Rb is formed so as to cover the first gate electrode 15*a* as shown in FIG. 21. Thereafter, the third conductive region 13*aa*, the fourth conductive region 13*ab*, and the second channel region 13*ac* are formed in the second semiconductor layer 13*a* by doping with the impurity ions Ip such as phosphorus using the second gate electrode 15*b* as a mask, and the first conductive layer 12*b* and the second conductive layer 12*c* are formed by modifying the first polysilicon layer 12*bp* and the second polysilicon layer 12*cp* into a conductor. Hence, the first TFTs 9A, which are of a P type, and the seconds TFT 9B, which are of a N type, can be formed on the same substrate.

In addition, other than the first semiconductor layer 12*a* and the second semiconductor layer 13*a*, a third semiconductor 12*d* (see FIG. 22) and a third gate electrode 15*c* that corresponds to the third semiconductor 12*d* (see FIG. 22) are formed in advance. Then, in the ion doping step in the TFT layer formation step above, first of all, the resist Ra is formed so as to cover the second gate electrode 15*b* and the third gate electrode 15*c*, and thereafter the first conductive region 12*aa*, the second conductive region 12*ab*, and the first channel region 12*ac* are formed in the first semiconductor layer 12*a* by doping with the impurity ions Ib such as boron using the first gate electrode 15*a* as a mask, as shown in FIG. 22. Subsequently, the resist Ra is removed, and the resist Rb is formed so as to cover the first gate electrode 15*a* as shown in FIG. 23. Thereafter, by doping with the impurity ions Ip such as phosphorus using the second gate electrode 15*b* and the third gate electrode 15*c* as a mask, the third conductive region 13*aa*, the fourth conductive region 13*ab*, and the second channel region 13*ac* are formed in the second semiconductor layer 13*a*, and a conductive region 12*da*, a conductive region 12*db*, and a channel region 12*dc* are formed in the third semiconductor 12*d*, and the first conductive layer 12*b* and the second conductive layer 12*c* are formed by modifying the first polysilicon layer 12*bp* and the second polysilicon layer 12*cp* into a conductor. Hence, first TFTs 9Aa, which are of a P type, first TFTs 9Ab, which are of a N type, and the second TFTs 9B, which are of a N type, can be formed on the same substrate, and a high performance drive circuit can be formed in the frame area F by combining the P-type, first TFT 9Aa and the N-type, first TFT 9Ab to construct a CMOS (complementary metal oxide semiconductor).

As described above, according to the organic EL display device in accordance with the present embodiment and the method of manufacturing the organic EL display device, the first semiconductor layer 12*a*, the first polysilicon layer 12*bp*, and the second polysilicon layer 12*cp* are formed of a polysilicon in the first semiconductor layer formation step, and the second semiconductor layer 13*a* is formed of an oxide semiconductor on the first polysilicon layer 12*bp* and the second polysilicon layer 12*cp* in the second semiconductor layer formation step. Thereafter, in the ion doping step, the first conductive region 12*aa* and the second conductive region 12*ab*, both of which are of a p type, are formed in the first semiconductor layer 12*a* by doping the first semiconductor layer 12*a* with the impurity ions Ib, the third conductive region 13*aa* and the fourth conductive region 13*ab* are formed in the second semiconductor layer 13*a* by doping the second semiconductor layer 13*a*, the first polysilicon layer 12*bp*, and the second polysilicon layer 12*cp* with the impurity ions Ip, and the first conductive layer 12*b* and the second conductive layer 12*c*, both of which are of a $n^+$ type, are also formed by modifying the first polysilicon layer 12*bp* and the second polysilicon layer 12*cp* into a conductor. Furthermore, in the interlayer insulating film formation step, the first contact hole Ha, the second contact hole Hb, the third contact hole Hc, and the fourth contact hole Hd are formed through a stack of the gate insulating film 14, the first interlayer insulating film 16, and the second interlayer insulating film 18, reaching the first conductive region 12*aa*, the second conductive region 12*ab*, the first conductive layer 12*b*, and the second conductive layer 12*c*. Here, the third contact hole Hc and the fourth contact hole Hd are formed so as to reach the first conductive layer 12*b* and the second conductive layer 12*c*, which are made of a polysilicon that is poorly dissolvable in hydrofluoric acid and which are modified into a conductor, not to reach the third conductive region 13*aa* and the fourth conductive region 13*ab*, which are made of an oxide semiconductor that is readily dissolvable in hydrofluoric acid. Therefore, the first contact hole Ha, the second contact hole Hb, the third contact hole Hc, and the fourth contact hole Hd can be collectively formed.

In addition, according to the organic EL display device in accordance with the present embodiment and the method of manufacturing the organic EL display device, when the P-type, first TFT 9Aa and the N-type, first TFT 9Ab are formed as the first TFT, a high performance drive circuit can be formed in the frame area F by combining the first TFT 9Aa and the first TFT 9Ab so as to construct a CMOS.

OTHER EMBODIMENTS

The foregoing embodiments have discussed examples where the organic EL layer has a 5-layer structure that includes a hole injection layer, a hole transport layer, a light-emitting layer, an electron transport layer, and an electron injection layer. Alternatively, the organic EL layer may have, for example, a 3-layer structure that includes a hole injection and transport layer, a light-emitting layer, and an electron transport and injection layer.

In addition, the foregoing embodiments have discussed examples where the organic EL display device includes a first electrode as an anode and a second electrode as a cathode. The disclosure is equally applicable to organic EL display devices in which the layered structure of the organic EL layer is reversed, to include a first electrode as a cathode and a second electrode as an anode.

In addition, the forgoing embodiments have discussed organic EL display devices as an example of the display device. The disclosure is equally applicable to display devices including liquid crystal display devices that operate by an active matrix driving scheme.

In addition, the foregoing embodiments have discussed organic EL display devices as an example of the display device. The disclosure is equally applicable to display devices including a plurality of current-driven light-emitting elements, for example, applicable to display devices including QLEDs (quantum-dot light-emitting diodes) which are light-emitting elements using a quantum-dot-containing layer.

INDUSTRIAL APPLICABILITY

As described above, the disclosure is useful in flexible display devices.

The invention claimed is:

1. A display device comprising:

a base substrate layer; and a thin film transistor layer on the base substrate layer, the thin film transistor layer including, in each of a plurality of subpixels:

a first thin film transistor including a first semiconductor layer comprising a polysilicon; and a second thin film transistor including a second semiconductor layer comprising an oxide semiconductor, wherein the first thin film transistor includes:

the first semiconductor layer, including a first conductive region and a second conductive region at a first distance from each other;

a first gate insulating film on the first semiconductor layer;

a first gate electrode on the first gate insulating film, the first gate electrode being configured to control conduction between the first conductive region and the second conductive region;

an interlayer insulating film covering the first gate electrode; and a first terminal electrode and a second terminal electrode on the interlayer insulating film at a second distance from each other, the first terminal electrode and the second terminal electrode being electrically connected, respectively, to the first conductive region and the second conductive region via, respectively, a first contact hole and a second contact hole formed at least through the interlayer insulating film, the second thin film transistor includes:

the second semiconductor layer, including a third conductive region and a fourth conductive region at a third distance from each other;

a first conductive layer and a second conductive layer on a base substrate layer side of the third conductive region and the fourth conductive region, respectively, the first conductive layer and the second conductive layer being made of a same material, and provided in a same layer, as the first semiconductor layer;

a second gate insulating film on the second semiconductor layer;

a second gate electrode on the second gate insulating film, the second gate electrode being configured to control conduction between the third conductive region and the fourth conductive region;

the interlayer insulating film covering the second gate electrode; and a third terminal electrode and a fourth terminal electrode on the interlayer insulating film at a fourth distance from each other, the third terminal electrode and the fourth terminal electrode being electrically connected, respectively, to the first conductive layer and the second conductive layer via, respectively, a third contact hole and a fourth contact hole formed at least through the interlayer insulating film, the second gate insulating film is made of a same material, and provided in a same layer, as the first gate insulating film, the first gate insulating film is insularly provided, such that the first gate insulating film overlaps the first gate electrode, the second gate insulating film is insularly provided, such that the second gate insulating film overlaps the second gate electrode, and in a cross-sectional view taken in a direction in which the first terminal electrode, the second terminal electrode, the third terminal electrode, and the fourth terminal electrode are arranged, a side surface of the first gate insulating film is substantially aligned with a side surface of the first gate electrode, and a side surface of the second gate insulating film is substantially aligned with a side surface of the second gate electrode.

2. The display device according to claim 1, wherein the first gate insulating film and the second gate insulating film together form an integrally formed gate insulating film.

3. The display device according to claim 2, wherein the first contact hole, the second contact hole, the third contact hole, and the fourth contact hole are formed through the integrally formed gate insulating film and the interlayer insulating film.

4. The display device according to claim 1, wherein the first gate insulating film and the second gate insulating film have at least a base substrate layer side including a silicon oxide film.

5. The display device according to claim 1, wherein the first conductive region, the second conductive region, the first conductive layer, and the second conductive layer are doped with phosphorus.

6. The display device according to claim 1, wherein
the first conductive region and the second conductive region are doped with boron, and
the first conductive layer and the second conductive layer are doped with phosphorus.

7. The display device according to claim 1, wherein;
the second thin film transistor is an N-type thin film transistor in which the first conductive layer and the second conductive layer are doped with phosphorus, and
the first thin film transistor includes:
an N-type thin film transistor in which the first conductive region and the second conductive region are doped with phosphorus; and
a P-type thin film transistor in which the first conductive region and the second conductive region are doped with boron.

8. The display device according to claim 1, further comprising:
a light-emitting element layer on the thin film transistor layer, the light-emitting element layer including a plurality of light-emitting elements corresponding to the plurality of subpixels; and
a sealing film covering the light-emitting element layer.

9. The display device according to claim 8, wherein the plurality of light-emitting elements are organic electroluminescence elements.

10. The display device according to claim 1, wherein the side surface of the first gate insulating film and the side surface of the first gate electrode are on a first surface, the side surface of the second gate insulating film and the side surface of the second gate electrode are on a second surface, and the first surface and the second surface are flush with each other.

11. A method of manufacturing a display device, the display device including:
a base substrate layer; and
a thin film transistor layer on the base substrate layer,
the thin film transistor layer including, in each of a plurality of subpixels:
a first thin film transistor including a first semiconductor layer comprising a polysilicon; and
a second thin film transistor including a second semiconductor layer comprising an oxide semiconductor,
wherein the first thin film transistor includes:
the first semiconductor layer, including a first conductive region and a second conductive region at a first distance from each other;
a first gate insulating film on the first semiconductor layer;
a first gate electrode on the first gate insulating film, the first gate electrode being configured to control conduction between the first conductive region and the second conductive region;
an interlayer insulating film covering the first gate electrode; and
a first terminal electrode and a second terminal electrode on the interlayer insulating film at a second distance from each other, the first terminal electrode and the second terminal electrode being electrically connected, respectively, to the first conductive region and the second conductive region via, respectively, a first contact hole and a second contact hole formed at least through the interlayer insulating film,
the second thin film transistor includes:
the second semiconductor layer including a third conductive region and a fourth conductive region at a third distance from each other;
a first conductive layer and a second conductive layer on a base substrate layer side of the third conductive region and the fourth conductive region, respectively, the first conductive layer and the second conductive layer being made of a same material, and provided in a same layer, as the first semiconductor layer;
a second gate insulating film on the second semiconductor layer;
a second gate electrode on the second gate insulating film, the second gate electrode being configured to control conduction between the third conductive region and the fourth conductive region;
the interlayer insulating film covering the second gate electrode; and
a third terminal electrode and a fourth terminal electrode on the interlayer insulating film at a fourth distance from each other, the third terminal electrode and the fourth terminal electrode being electrically connected, respectively, to the first conductive layer and the second conductive layer via, respectively, a third contact hole and a fourth contact hole formed at least through the interlayer insulating film,
the method comprising:
forming, on the base substrate layer, the first semiconductor layer, a first polysilicon layer that will be the first conductive layer, and a second polysilicon layer that will be the second conductive layer;
forming the second semiconductor layer on the first polysilicon layer and the second polysilicon layer;
forming the first gate insulating film and the second gate insulating film so as to cover the first semiconductor layer and the second semiconductor layer, respectively;
forming the first gate electrode and the second gate electrode on the first gate insulating film and the second gate insulating film, respectively;
forming the first conductive region and the second conductive region in the first semiconductor layer, and forming the third conductive region and the fourth conductive region in the second semiconductor layer, by doping the first semiconductor layer with impurity ions using the first gate electrode as a mask, and by doping the second semiconductor layer, the first polysilicon layer, and the second polysilicon layer with the impurity ions using the second gate electrode as a mask;
forming the first conductive layer and the second conductive layer by modifying the first polysilicon layer and the second polysilicon layer into a conductor;
after forming the interlayer insulating film so as to cover the first gate electrode and the second gate electrode, forming the first contact hole, the second contact hole, the third contact hole, and the fourth contact hole at least through the interlayer insulating film; and
forming the first terminal electrode, the second terminal electrode, the third terminal electrode, and the fourth terminal electrode on the interlayer insulating film, wherein:
the first gate insulating film is insularly provided, such that the first gate insulating film overlaps the first gate electrode,
the second gate insulating film is insularly provided, such that the second gate insulating film overlaps the second gate electrode, and in a cross-sectional view taken in a direction in which the first terminal electrode, the second terminal electrode, the third terminal electrode, and the fourth terminal electrode are arranged, a side surface of the first gate insulating film is substantially aligned with a side surface of the first gate electrode, and a side surface of the second gate insulating film is substantially aligned with a side surface of the second gate electrode.

12. The method according to claim 11, further comprising:

forming a planarization film so as to cover the first terminal electrode, the second terminal electrode, the third terminal electrode, and the fourth terminal electrode;

forming a light-emitting element layer, including a plurality of light-emitting elements corresponding to the plurality of subpixels, on the planarization film; and forming a sealing film so as to cover the light-emitting element layer.

13. The method according to claim 12, wherein the plurality of light-emitting elements are organic electroluminescence elements.

14. A display device comprising:

a base substrate layer; and a thin film transistor layer on the base substrate layer, the thin film transistor layer including, in each of a plurality of subpixels:

a first thin film transistor including a first semiconductor layer comprising a polysilicon; and a second thin film transistor including a second semiconductor layer comprising an oxide semiconductor, wherein the first thin film transistor includes:

the first semiconductor layer, including a first conductive region and a second conductive region at a first distance from each other;

a first gate insulating film on the first semiconductor layer;

a first gate electrode on the first gate insulating film, the first gate electrode being configured to control conduction between the first conductive region and the second conductive region;

an interlayer insulating film covering the first gate electrode; and a first terminal electrode and a second terminal electrode on the interlayer insulating film at a second distance from each other, the first terminal electrode and the second terminal electrode being electrically connected, respectively, to the first conductive region and the second conductive region via, respectively, a first contact hole and a second contact hole formed at least through the interlayer insulating film, the second thin film transistor includes:

the second semiconductor layer including a third conductive region and a fourth conductive region at a third distance from each other;

a first conductive layer and a second conductive layer on a base substrate layer side of the third conductive region and the fourth conductive region, respectively, the first conductive layer and the second conductive layer being made of a same material, and provided in a same layer, as the first semiconductor layer;

a second gate insulating film on the second semiconductor layer;

a second gate electrode on the second gate insulating film, the second gate electrode being configured to control conduction between the third conductive region and the fourth conductive region;

the interlayer insulating film covering the second gate electrode; and a third terminal electrode and a fourth terminal electrode on the interlayer insulating film at a fourth distance from each other, the third terminal electrode and the fourth terminal electrode being electrically connected, respectively, to the first conductive layer and the second conductive layer via, respectively, a third contact hole and a fourth contact hole formed at least through the interlayer insulating film, the second gate insulating film is made of a same material, and provided in a same layer, as the first gate insulating film, and the first conductive region, the second conductive region, the first conductive layer, the second conductive layer, the third conductive region, and the fourth conductive region contain impurity ions, wherein a concentration of the impurity ions in a region of the first conductive layer that overlaps with the third conductive region is lower than a concentration of the impurity ions in a region of the first conductive layer that does not overlap with the third conductive region, and a concentration of the impurity ions in a region of the first conductive layer that overlaps with the fourth conductive region is lower than a concentration of the impurity ions in a region of the first conductive layer that does not overlap with the fourth conductive region.

15. The display device according to claim 14, wherein the first gate insulating film and the second gate insulating film together comprise an integrally formed gate insulating film.

16. The display device according to claim 15, wherein the first contact hole, the second contact hole, the third contact hole, and the fourth contact hole are formed through the integrally formed gate insulating film and the interlayer insulating film.

17. The display device according to claim 14, wherein:

the first gate insulating film is insularly provided, such that the first gate insulating film overlaps the first gate electrode, and the second gate insulating film is insularly provided, such that the second gate insulating film overlaps the second gate electrode.

18. The display device according to claim 14, wherein the first gate insulating film and the second gate insulating film each have at least the base substrate layer side including a silicon oxide film.

19. The display device according to claim 14, wherein the first conductive region, the second conductive region, the first conductive layer, and the second conductive layer are doped with phosphorus.

20. The display device according to claim 14, wherein:

the first conductive region and the second conductive region are doped with boron, and the first conductive layer and the second conductive layer are doped with phosphorus.

* * * * *